United States Patent
Satonaga et al.

(10) Patent No.: US 8,326,564 B2
(45) Date of Patent: Dec. 4, 2012

(54) DETECTED DATA PROCESSING APPARATUS AND COMPUTER READABLE MEDIUM FOR DETECTING DATA

(75) Inventors: Tetsuichi Satonaga, Kanagawa (JP); Koji Adachi, Kanagawa (JP); Kaoru Yasukawa, Kanagawa (JP); Norikazu Yamada, Kanagawa (JP); Koki Uwatoko, Kanagawa (JP); Shigehiro Furukawa, Kanagawa (JP)

(73) Assignee: Fuji Xerox Co., Ltd, Tokyo (JP)

( * ) Notice: Subject to any disclaimer, the term of this patent is extended or adjusted under 35 U.S.C. 154(b) by 529 days.

(21) Appl. No.: 12/505,760

(22) Filed: Jul. 20, 2009

(65) Prior Publication Data

US 2010/0235140 A1 Sep. 16, 2010

(30) Foreign Application Priority Data

Mar. 16, 2009 (JP) .................... 2009-062497

(51) Int. Cl.
*G01N 37/00* (2006.01)
*G01R 31/00* (2006.01)
(52) U.S. Cl. ............... 702/118; 702/81; 702/179
(58) Field of Classification Search ........... 702/179
See application file for complete search history.

(56) References Cited

U.S. PATENT DOCUMENTS

| | | | | |
|---|---|---|---|---|
| 2002/0156549 A1* | 10/2002 | Hayashi | ........... | 700/108 |
| 2003/0154052 A1* | 8/2003 | Samata et al. | ........... | 702/184 |
| 2004/0228186 A1* | 11/2004 | Kadota | ........... | 365/202 |
| 2006/0176066 A1* | 8/2006 | Schmid et al. | ........... | 324/763 |

FOREIGN PATENT DOCUMENTS

| | | |
|---|---|---|
| JP | A-11-339089 | 12/1999 |
| JP | A-2000-114130 | 4/2000 |
| JP | A-2000-356569 | 12/2000 |
| JP | A-2002-318617 | 10/2002 |
| JP | A-2003-077780 | 3/2003 |
| JP | A-2003-141306 | 5/2003 |
| JP | 2005061853 A * | 3/2005 |
| JP | A-2005-061853 | 3/2005 |
| JP | A-2008-108250 | 5/2008 |

OTHER PUBLICATIONS

Office Action issued in Japanese Application No. 2009-062497 dated Jan. 25, 2011 (with translation).

* cited by examiner

*Primary Examiner* — Sujoy Kundu
*Assistant Examiner* — Michael Dalbo
(74) *Attorney, Agent, or Firm* — Oliff & Berridge, PLC

(57) ABSTRACT

A detected data processing apparatus includes a selecting unit that calculates mutual correlation between a plurality of groups of detected data acquired from a detecting unit that detects an operational state of a circuit board, and then selects as analysis data the detected data of a group whose value indicating correlation with other groups is smaller than a threshold value set up in advance; and a first calculating unit that calculates a first Mahalanobis distance on a basis of a first Mahalanobis space generated by using the analysis data selected by the selecting unit from the detected data obtained when a normal circuit board is operated and on a basis of the detected data obtained when a circuit board of diagnosis target is operated.

6 Claims, 20 Drawing Sheets

DETECTED DATA

FEATURE VALUE

FIG. 11A

| CASE | FEATURE VALUE FOR EACH PERIOD | | | |
|---|---|---|---|---|
| | 1 | 2 | ... | K |
| 1 | $x_{11}$ | $x_{12}$ | ... | $x_{1K}$ |
| 2 | $x_{21}$ | $x_{22}$ | ... | $x_{2K}$ |
| ... | ... | ... | ... | ... |
| Ncase | $x_{Ncase1}$ | $x_{Ncase2}$ | ... | $x_{NcaseK}$ |
| AVERAGE | $m_1$ | $m_2$ | ... | $m_K$ |
| STANDARD DEVIATION | $s_1$ | $s_2$ | ... | $s_K$ |

FIG. 11B

| CASE | FEATURE VALUE FOR EACH PERIOD (NORMALIZED) | | | |
|---|---|---|---|---|
| | 1 | 2 | ... | K |
| 1 | $u_{11}$ | $u_{12}$ | ... | $u_{1K}$ |
| 2 | $u_{21}$ | $u_{22}$ | ... | $u_{2K}$ |
| ... | ... | ... | ... | ... |
| Ncase | $u_{Ncase1}$ | $u_{Ncase2}$ | ... | $u_{NcaseK}$ |
| AVERAGE | 0 | 0 | ... | 0 |
| STANDARD DEVIATION | 1 | 1 | ... | 1 |

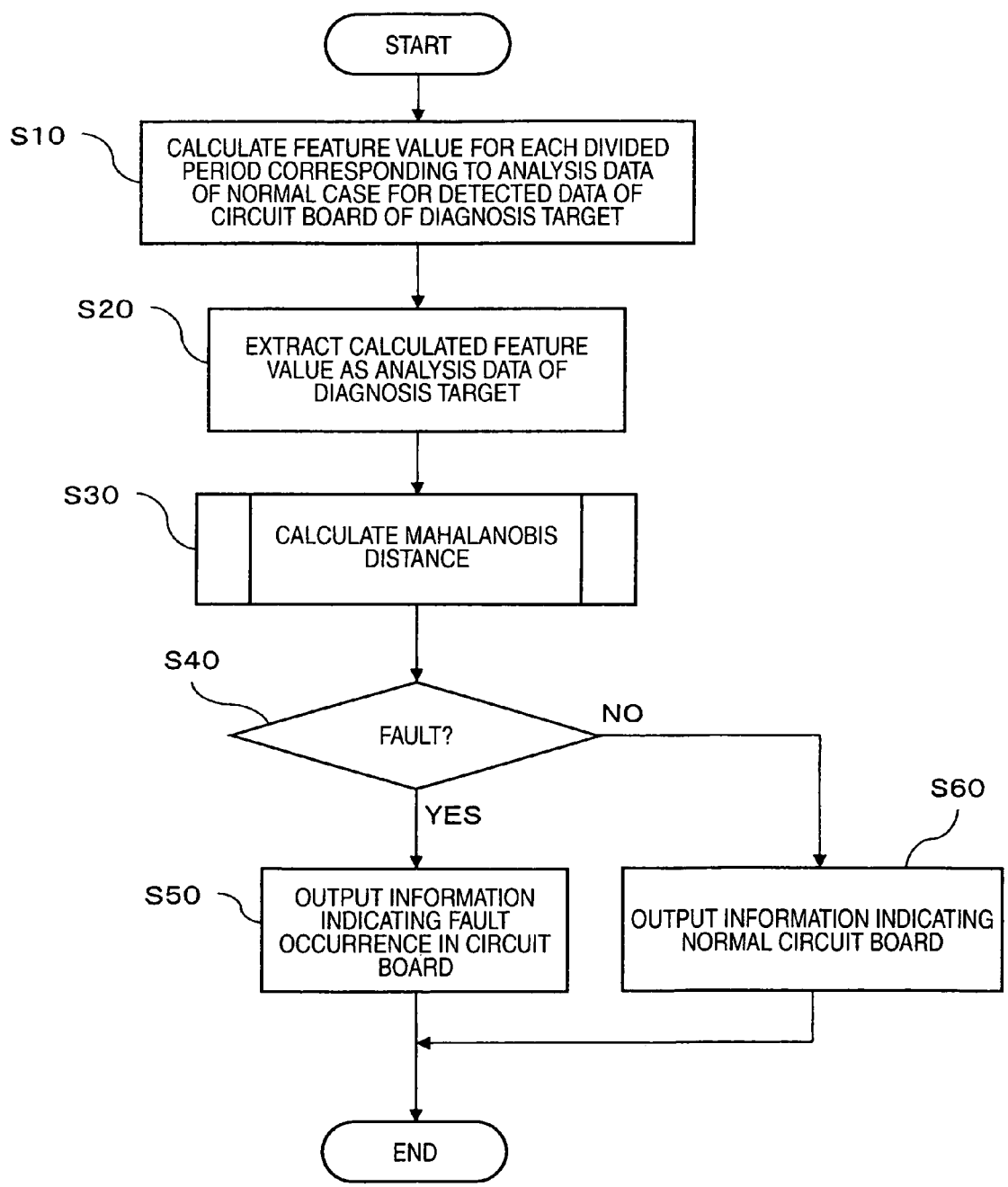

| | CASE | MAHALANOBIS DISTANCE (FIRST STAGE) | | | |
|---|---|---|---|---|---|
| | | COIL 1 | COIL 2 | ... | COIL 24 |
| NORMAL | 1 | $MD_{1,1}$ | $MD_{1,2}$ | ... | $MD_{1,24}$ |
| | 2 | $MD_{2,1}$ | $MD_{2,2}$ | ... | $MD_{2,24}$ |
| | ... | ... | ... | ... | ... |
| | Ncase | $MD_{Ncase,1}$ | $MD_{Ncase,2}$ | ... | $MD_{Ncase,24}$ |
| DIAGNOSIS TARGET | | $MD_{p,1}$ | $MD_{p,2}$ | ... | $MD_{p,24}$ |

FIG. 20

L28 ORTHOGONALITY TABLE

|   | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|
| 1 | O | O | O | O | O | O | O | O | O | O | O | O | O | O | O | O | O | O | O | O | O | O | O | O | O | O | O |
| 2 | O | O | × | O | O | × | × | × | × | O | O | × | O | × | × | O | × | O | O | × | × | × | × | O | O | × | O |
| 3 | O | O | O | × | O | O | × | × | × | × | O | O | × | × | O | × | O | × | O | O | × | × | × | × | O | O | × |
| 4 | × | O | O | O | × | O | O | × | × | × | × | O | O | × | × | O | × | O | × | O | O | × | × | × | × | O | O |
| 5 | O | × | O | O | O | × | O | O | × | × | × | × | O | × | O | × | O | × | O | × | O | O | × | × | × | × | O |
| 6 | O | O | × | O | O | O | × | O | O | × | × | × | × | × | O | O | × | O | × | O | × | O | O | × | × | × | × |
| 7 | × | O | O | × | O | O | O | × | O | O | × | × | × | × | × | O | O | × | O | × | O | × | O | O | × | × | × |
| 8 | × | × | O | O | × | O | O | O | × | O | O | × | × | × | × | × | O | O | × | O | × | O | × | O | O | × | × |
| 9 | × | × | × | O | O | × | O | O | O | × | O | O | × | × | × | × | × | O | O | × | O | × | O | × | O | O | × |
| 10 | × | × | × | × | O | O | × | O | O | O | × | O | O | × | × | × | × | × | O | O | × | O | × | O | × | O | O |
| 11 | O | × | × | × | × | O | O | × | O | O | O | × | O | × | O | × | × | × | × | O | O | × | O | × | O | × | O |
| 12 | O | O | × | × | × | × | O | O | × | O | O | O | × | × | O | O | × | × | × | × | O | O | × | O | × | O | × |
| 13 | × | O | O | × | × | × | × | O | O | × | O | O | O | × | × | O | O | × | × | × | × | O | O | × | O | × | O |
| 14 | O | × | O | O | × | × | × | × | O | O | × | O | O | × | O | × | O | O | × | × | × | × | O | O | × | O | × |
| 15 | × | × | × | × | × | × | × | × | × | × | × | × | × | × | O | O | O | O | O | O | O | O | O | O | O | O | O |
| 16 | × | O | × | O | O | × | × | × | O | O | × | O | O | × | × | O | × | O | O | O | O | × | × | O | × | × | × |
| 17 | O | × | O | × | O | O | × | × | × | O | O | × | O | O | × | × | O | × | O | O | O | × | × | O | × | × | O |
| 18 | × | O | × | O | × | O | O | × | × | × | × | O | O | O | O | × | × | × | O | × | × | O | O | O | O | × | × |
| 19 | O | × | O | × | O | × | O | O | × | × | × | × | O | × | O | × | × | × | O | × | × | O | O | O | O | × | × |
| 20 | O | O | × | O | × | O | × | O | O | × | × | × | × | O | × | × | O | × | × | × | O | × | × | O | O | O | O |
| 21 | × | O | O | × | O | × | O | × | O | O | × | × | × | × | O | × | × | × | O | × | × | O | × | O | O | O | O |
| 22 | × | × | O | O | × | O | × | O | × | O | O | × | × | O | O | O | × | × | O | × | × | × | O | × | × | O | O |
| 23 | × | × | × | O | O | × | O | × | O | × | O | O | × | O | O | O | O | × | × | O | × | × | × | O | × | × | O |
| 24 | × | × | × | × | O | O | × | O | × | O | × | O | O | O | O | O | O | × | × | O | × | × | × | O | × | × | × |
| 25 | O | × | × | × | × | O | O | × | O | × | O | × | O | O | × | O | O | O | O | × | × | O | × | × | × | O | × |
| 26 | O | O | × | × | × | × | O | O | × | O | × | O | × | O | × | × | O | O | O | × | × | O | × | × | × | × | O |
| 27 | × | O | O | × | × | × | × | O | O | × | O | × | O | × | × | O | O | O | O | × | × | O | × | × | × | × |
| 28 | O | × | O | O | × | × | × | × | O | O | × | O | × | O | × | O | × | O | O | O | × | × | O | × | × | × |

L28 FACTOR-EFFECT DIAGRAM (LEFT: USED, RIGHT: NOT USED)

FIG. 22

| CAUSE OF FAULT | CASE | MAHALANOBIS DISTANCE (FIRST STAGE) | | |
|---|---|---|---|---|
| | | COIL 1 | COIL 2 | ... | COIL 24 |
| | 1 | $MD_{A,1}$ | $MD_{A,2}$ | ... | $MD_{A,24}$ |
| | 1 | $MD_{B,1-1}$ | $MD_{B,1-2}$ | ... | $MD_{B,1-24}$ |
| | 2 | $MD_{B,2-1}$ | $MD_{B,2-2}$ | ... | $MD_{B,2-24}$ |
| ... | | ... | ... | ... | ... |

FIG. 23

| L28 | DETECTION SECTION (COIL) NUMBER | | | | | FAULT A | | | | FAULT B | | |
|---|---|---|---|---|---|---|---|---|---|---|---|---|
| | 1 | 2 | ... | 27 | | 1 | 2 | ... | | 1 | 2 | ... |
| 1 | ○ | ○ | ... | ○ | | $\eta_{A-L28-1}$ | | | | $\eta_{B-L28-1-1}$ | $\eta_{B-L28-2-1}$ | ... |
| 2 | ○ | ○ | ... | × | | $\eta_{A-L28-2}$ | | | | $\eta_{B-L28-1-2}$ | $\eta_{B-L28-2-2}$ | ... |
| 3 | ○ | ○ | ... | ○ | | $\eta_{A-L28-3}$ | | | | $\eta_{B-L28-1-3}$ | $\eta_{B-L28-2-3}$ | ... |
| ... | ... | ... | ... | ... | | ... | | | | ... | ... | ... |
| 27 | × | ○ | ... | × | | $\eta_{A-L28-27}$ | | | | $\eta_{B-L28-1-27}$ | $\eta_{B-L28-2-27}$ | ... |
| 28 | ○ | × | ... | × | | $\eta_{A-L28-28}$ | | | | $\eta_{B-L28-1-28}$ | $\eta_{B-L28-2-28}$ | ... |

DETECTED DATA PROCESSING APPARATUS AND COMPUTER READABLE MEDIUM FOR DETECTING DATA

CROSS-REFERENCE TO RELATED APPLICATION

This application is based on and claims priority under 35 USC 119 from Japanese Patent Application No. 2009-062497 filed Mar. 16, 2009.

BACKGROUND

1. Technical Field

The present invention relates to a detected data processing apparatus and a program.

2. Related Art

In general, in electronic equipments such as personal computers and copying machines, in order that their performance and functions should be realized, analog and digital electronic circuits for various applications are installed in the form of a printed wired board assembly referred to as a PWBA (simply referred to as a "circuit board", hereinafter). Further also in other industrial machinery in the fields of automobile, aviation, robot, semiconductor design system and the like, a large number of circuit boards that permit reliable, high-speed, and precision operation are installed as unit for operation control and the like. For the purpose of realizing a series of functions, these circuit boards are connected to each other in various forms through cables, so that the desired specification is realized.

Meanwhile, environments where equipments provided with such circuit boards are to be installed are usually offices and houses. Nevertheless, other severe environments are also selected in some cases. Thus, especially when the operating environment is severe, various kinds of abnormalities, faults, and the like can occur even when the equipments are used in an ordinary manner. Further, even when the equipments are used under ordinary environments, abnormalities, faults, and the like can occur in the electronic circuits, and the frequency of these is not negligibly low. Abnormalities, faults, and the like having occurred in such circuit boards need be treated immediately from the viewpoint of safety and cost. Accordingly, in equipments provided with circuit boards, detection of abnormalities or faults in the circuit boards is performed in some cases.

On the other hand, a technique has been proposed that employs a Mahalanobis distance in detection of abnormalities or faults in various kinds of apparatuses.

In a case that abnormalities or faults in an apparatus or the like are to be detected by using a Mahalanobis distance, detection results with higher precision are obtained when a Mahalanobis space is generated on the basis of a parameter that represents the feature of the apparatus or the like to a more satisfactory extent.

Meanwhile, with progress of performance improvement, multi-functional construction, and the like of electronic equipments, a tendency arises that the configurations of circuit boards installed in the electronic equipments become complicated and diversified like in a configuration that a plurality of circuit boards are connected to each other. Thus, in such circuit boards installed in electronic equipments, prediction of the operational state of the circuit board at the time of occurrence of an abnormality or a fault is difficult in some cases.

Thus, when a Mahalanobis distance is used for detection of abnormalities or faults in circuit boards installed in electronic equipments, it is difficult that a parameter suitable for generating a Mahalanobis space is selected so that abnormalities or faults are detected with precision.

SUMMARY

According to an aspect of the invention, a detected data processing apparatus includes a selecting unit that calculates mutual correlation between a plurality of groups of detected data acquired from a detecting unit that detects an operational state of a circuit board, and then selects as analysis data the detected data of a group whose value indicating correlation with other groups is smaller than a threshold value set up in advance; and a first calculating unit that calculates a first Mahalanobis distance on a basis of a first Mahalanobis space generated by using the analysis data selected by the selecting unit from the detected data obtained when a normal circuit board is operated and on a basis of the detected data obtained when a circuit board of diagnosis target is operated.

BRIEF DESCRIPTION OF THE DRAWINGS

Embodiments of the invention will be described in detail based on the following figures, wherein:

FIG. 11A is a table showing an example of feature values used for generating a Mahalanobis space;

FIG. 11B is a table showing an example of feature values after normalization;

FIG. 12 is a flow chart showing an example of a procedure of fault diagnosis processing;

FIG. 20 is a diagram showing an example of an L28 orthogonality table;

FIG. 22 is a diagram showing an example of a Mahalanobis distance of first stage acquired for each cause of fault;

FIG. 23 is a diagram showing an example of an SN ratio calculated for each cause of fault;

DETAILED DESCRIPTION

In various kinds of exemplary embodiments of the present invention described below, processing for fault diagnosis of a circuit board is performed by using detected data acquired from detecting unit for detecting the operational state of a circuit board.

Figure 1:
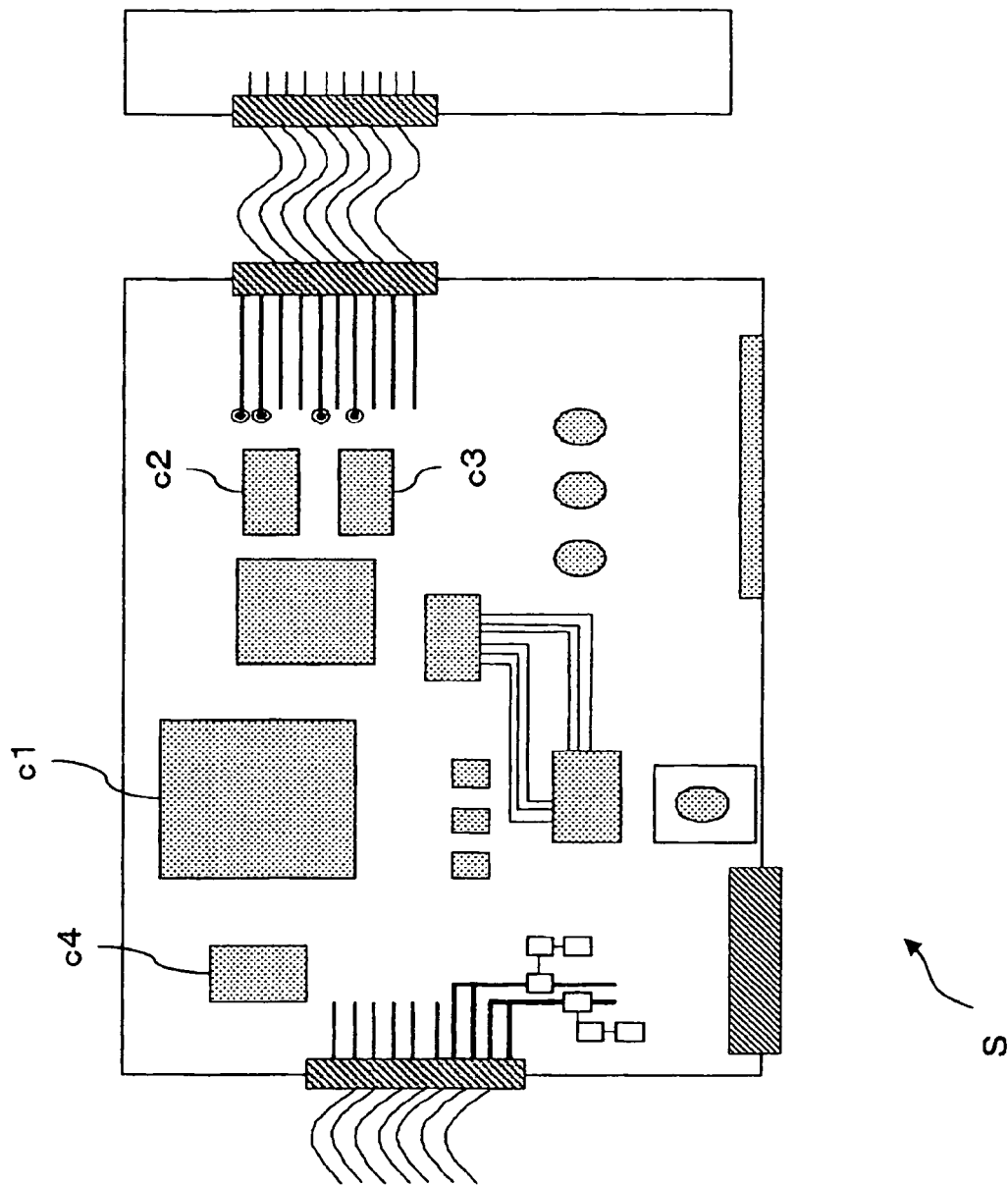
FIG. 1 is a diagram showing an example of a circuit board provided with detecting unit for detecting the operational state of a circuit board.

FIG. 1 is a diagram showing an example of a circuit board provided with detecting unit for detecting the operational state of a circuit board. Referring to FIG. 1, a circuit board S is provided with: various components such as a CPU (Central Processing Unit), an ASIC (Application Specific Integration Circuit), and an SDRAM (Synchronous Dynamic Random Access Memory); and wiring for electrically connecting the components to each other. The circuit board S is further provided with planar coils $c1$, $c2$, $c3$, and $c4$. Each planar coil $c$ is detecting unit for detecting the operational state of the circuit board S. The planar coil $c$ is arranged, for example, near each component and/or near the wiring on the circuit board S, and detects an induced electromotive force generated during the operation of the circuit board S. This induced electromotive force is used as detected data in the processing according to the exemplary embodiments given later. The planar coil $c$ is installed onto the circuit board S, for example, by a method that an FPC (Flexible Printed Circuit) in which a planar coil is wired is brought into close contact with the circuit board S.

Figure 2A:
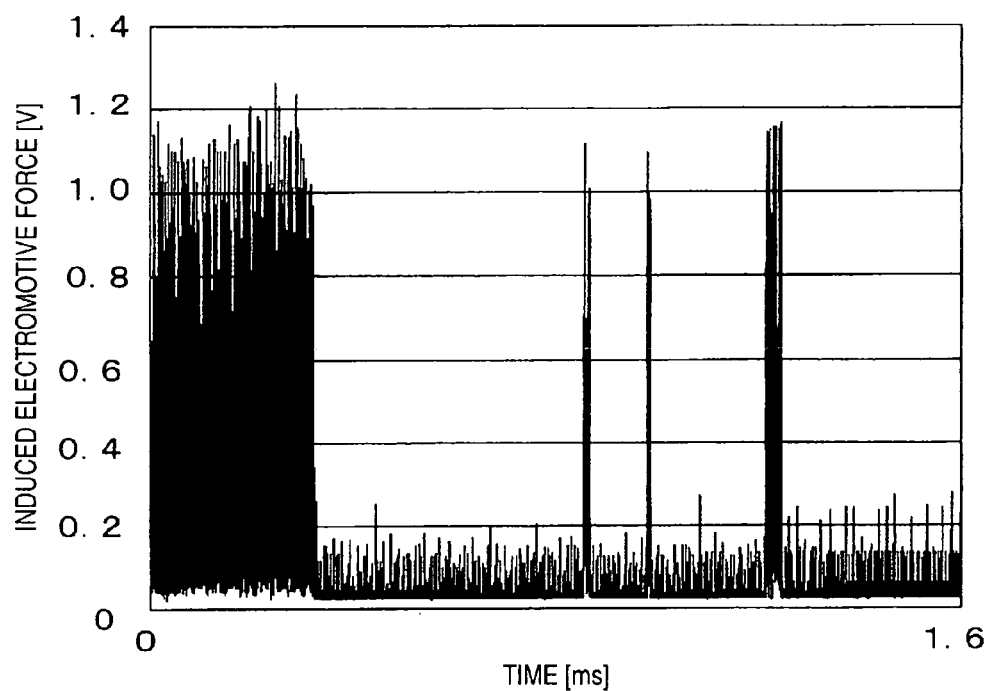
FIG. 2A is a diagram showing an example of a time-dependent change in an output signal of a planar coil provided on a circuit board.
Figure 2B:
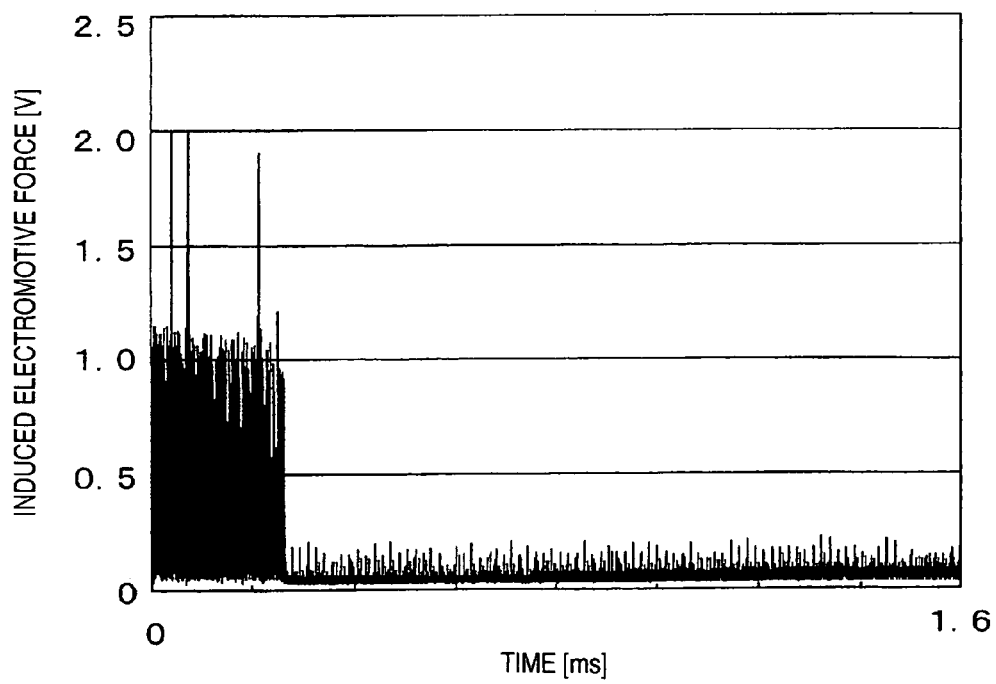
FIG. 2B is a diagram showing another example of a time-dependent change in an output signal of a planar coil provided on a circuit board.

FIGS. 2A and 2B show examples of a time-dependent change in the output signal of the planar coil $c$ obtained when the circuit board S is operated. FIG. 2A shows an example of the output signal of the planar coil $c$ obtained at the time of normal operation of the circuit board S. FIG. 2B shows an example of the output signal of the planar coil $c$ obtained at the time of faulty operation of the circuit board S. The output waveforms illustrated in FIGS. 2A and 2B are obtained from the planar coil $c$ provided at the same position on the circuit board S. The waveform of the output signal of the planar coil $c$ obtained at the time of fault occurrence in the circuit board S is different from that obtained at the time of normal operation. The output signal of the planar coil $c$ at the time of fault occurrence in the circuit board S can have various waveforms depending on the cause of fault in the circuit board S. Possible causes of faults include a poor component, wire disconnection, and a short circuit.

Figure 3:
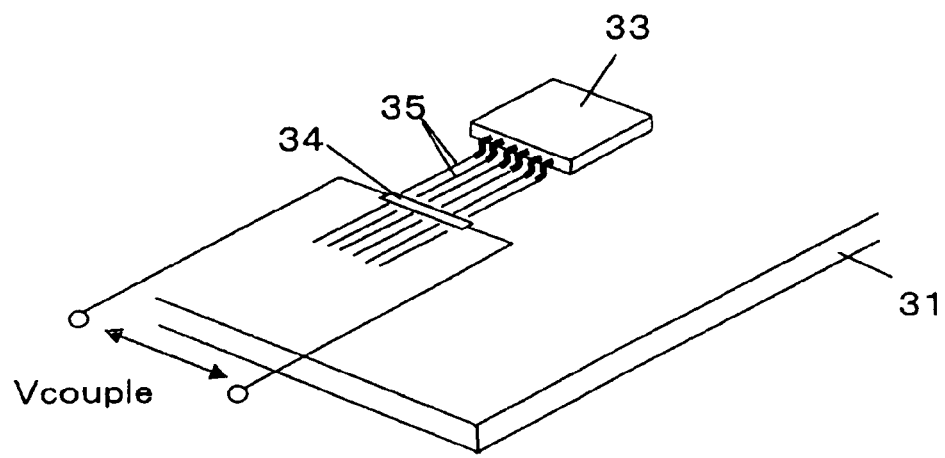
FIG. 3 is a diagram showing an example of a configuration of detecting unit for detecting the operational state of a circuit board.
Figure 4:
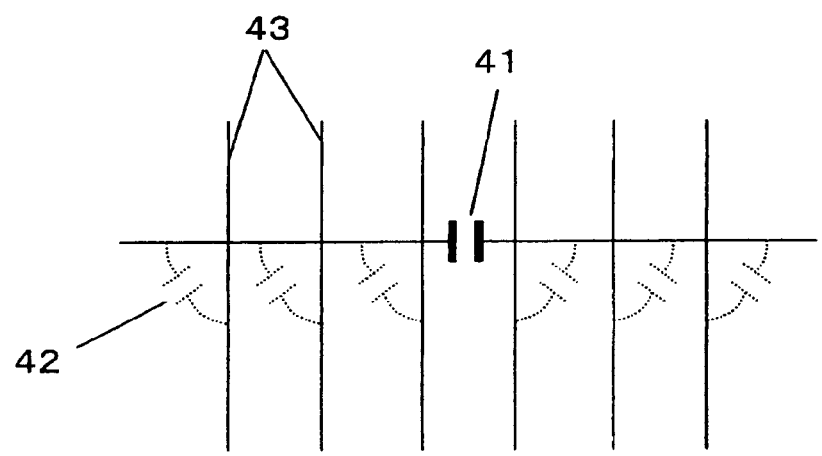
FIG. 4 is a diagram showing an equivalent circuit to an arrangement illustrated in FIG. 3.
Figure 5:
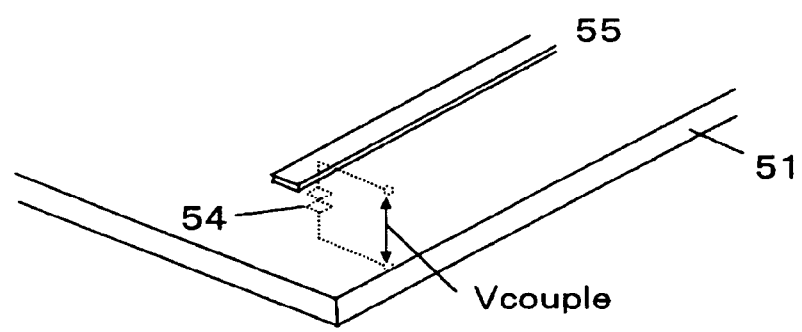
FIG. 5 is a diagram showing another example of a configuration of detecting unit for detecting the operational state of a circuit board.

Referring to FIGS. 3 to 5, an example is described below that detecting unit for detecting the operational state of a circuit board is constructed by a configuration other than a planar coil.

FIG. 3 shows an example that the operational state of a wiring group 35 directly connected from pins of an IC (Integrated Circuit) 33 provided on a circuit board 31 to an input/output section of the circuit board 31 is to be detected. A capacitance component 34 serving as an impedance component is arranged perpendicular to the wiring group 35, and then a potential Vcouple is measured that is generated across the two ends by cross talk caused at the time of occurrence of a change in the signal. FIG. 4 shows an equivalent circuit to the arrangement illustrated in FIG. 3. Referring to FIG. 4, a capacitance component 41 is arranged perpendicular to a wiring group 43. Then, a stray capacitance component 42 serving as a cause generating cross talk occurs between each of the lines constituting the capacitance component 41 and each line of the wiring group 35.

In FIG. 5, a capacitance component 54 is arranged perpendicular to the surface of a circuit board 51 in wiring (a microstrip line) 55 of single line connected to an input/output section of the circuit board 51. Then, a potential Vcouple is measured that is generated across the two ends by cross talk caused at the time of occurrence of a change in the signal. In this example, as illustrated in FIG. 5, the capacitance component 54 is provided for each of the input and output wiring on the circuit board 51. Then, the potential Vcouple is measured so that the state of signal change is acquired.

In the examples described with reference to FIGS. 3 to 5, the measured value for the potential Vcouple is used as detected data for the operational state of the circuit board.

Here, in the description of various kinds of exemplary embodiments given below, 24 planar coils (simply referred to as "coils", hereinafter) are provided on one circuit board, and then the induced electromotive force detected by each coil is used as detected data indicating the operational state of the circuit board. However, the type and the number of detecting unit pieces provided on the circuit board are not limited to these. That is, in the processing in various kinds of exemplary embodiments and modifications given below, for example, detecting unit for detecting detected data different from the induced electromotive force may be used like the capacitance components in the examples of FIGS. 3 to 5. Further, the number of detecting unit pieces provided in one circuit board may be a different number, for example, in accordance with the number of on-the-circuit-board positions where the developer or the like of the circuit board has determined that the operational state need be measured.

First Exemplary Embodiment

Figure 6:
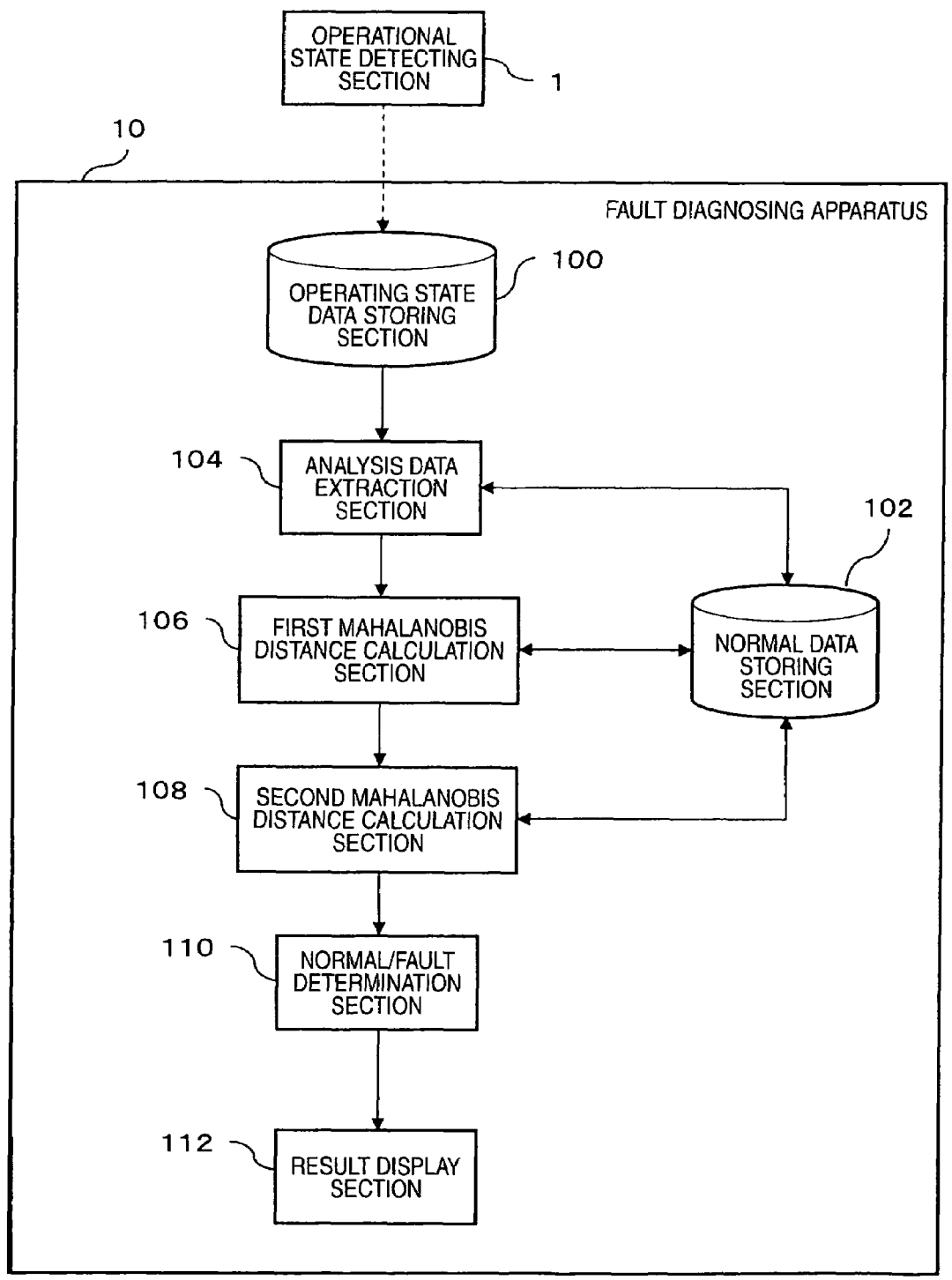
FIG. 6 is a block diagram showing an example of a configuration of a fault diagnosing apparatus.

FIG. 6 shows an example of a configuration of a fault diagnosing apparatus according to a first exemplary embodiment. A fault diagnosing apparatus 10 is electrically connected to an operational state detecting section 1 for detecting the operational state of a circuit board. In the present example, as described above, the operational state detecting section 1 has 24 coils provided on the circuit board.

The fault diagnosing apparatus 10 performs fault diagnosis of the circuit board by using detected data from the operational state detecting section 1. A part of the functions of the fault diagnosing apparatus 10 serves as a detected data processing apparatus of an exemplary embodiment of the present invention. The fault diagnosing apparatus 10 has an operating state data storing section 100, a normal data storing section 102, an analysis data extraction section 104, a first Mahalanobis distance calculation section 106, a second Mahalanobis distance calculation section 108, a normal/fault determination section 110, and a result display section 112.

The operating state data storing section 100 stores the detected data acquired from the operational state detecting section 1. In the present example, detected data of induced electromotive force acquired from the 24 coils provided on the circuit board is stored into the operating state data storing section 100.

The normal data storing section 102 stores the detected data acquired from the operational state detecting section 1 when a normal circuit board is operated. The normal data storing section 102 further stores various kinds of information such as analysis data and Mahalanobis spaces described later acquired from the detected data obtained when a normal circuit board is operated.

From the detected data of the circuit board of diagnosis target stored in the operating state data storing section 100 and the detected data stored in the normal data storing section 102, the analysis data extraction section 104 extracts analysis data used for the processing performed by the fault diagnosing apparatus 10.

The first Mahalanobis distance calculation section 106 calculates a Mahalanobis distance on the basis of a Mahalanobis space generated by using the analysis data extracted by the analysis data extraction section 104 from the detected data of a normal circuit board and on the basis of the analysis data extracted by the analysis data extraction section 104 from the detected data of the circuit board of diagnosis target.

The second Mahalanobis distance calculation section 108 recalculates a Mahalanobis distance by using the Mahalanobis distance of the analysis data of a normal circuit board for the Mahalanobis space used by the first Mahalanobis distance calculation section 106 and by using the Mahalanobis distance calculated by the first Mahalanobis distance calculation section 106 for the circuit board of diagnosis target.

The normal/fault determination section 110 determines the presence or absence of a fault in the circuit board of diagnosis target by using the Mahalanobis distance calculated by the second Mahalanobis distance calculation section 108.

The result display section 112 displays the result of determination performed by the normal/fault determination section 110.

Details of the processing performed by each section of the fault diagnosing apparatus 10 are described below.

Figure 7:
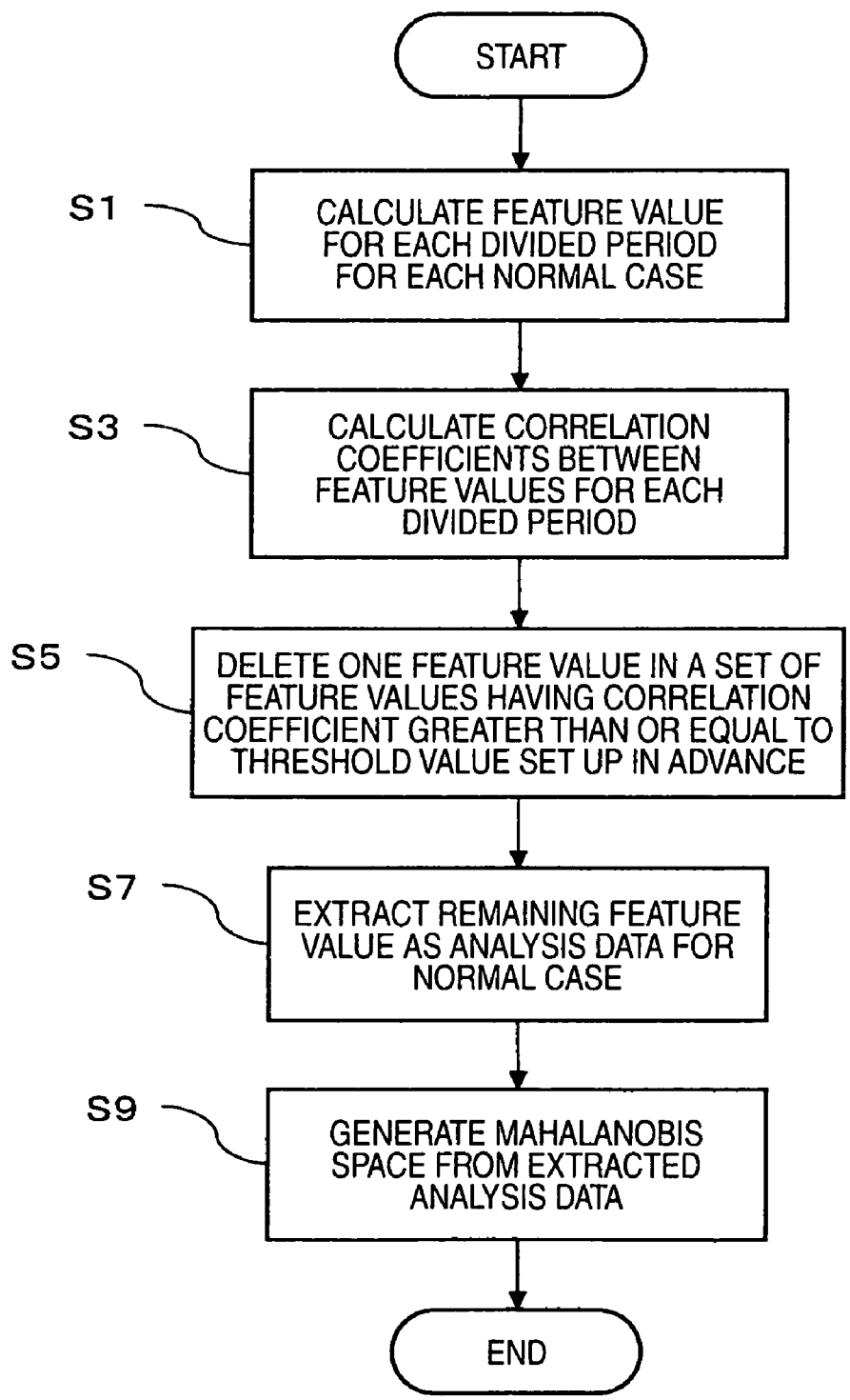
FIG. 7 is a flow chart showing an example of a procedure of processing performed by a fault diagnosing apparatus.

FIG. 7 is a flow chart showing an example of a procedure of processing of generating a Mahalanobis space uses by the first Mahalanobis distance calculation section 106. The processing according to the procedure of the example of FIG. 7 corresponds to preparation for fault diagnosis processing to be performed on the circuit board of diagnosis target.

The Mahalanobis space is generated on the basis of the detected data of a normal circuit board stored in the normal data storing section 102. It is assumed that at the time of start of the processing of the example of FIG. 7, the normal data storing section 102 stores, in advance, detected data of a plurality of cases for a normal circuit board. Here, detected data of one "case" indicates that detected data obtained from the operational state detecting section 1 when a normal circuit board is operated for a time length set up in advance. In the present example, the detected data of each case contains time series data (see, for example, FIG. 2) of the induced electromotive force detected by each of the 24 coils provided on a normal circuit board. Here, the detected data of a plurality of cases may be detected data obtained when one normal circuit board is operated multiple times, or alternatively detected data obtained when a plurality of circuit boards (what understands that all are normal) in which the arrangement of components, the wiring between components, and the arrangement of coils are the same are operated individually. Further, these two may be mixed in a plurality of cases.

When the processing of the example of FIG. 7 is started, first, the analysis data extraction section 104 divides, into periods set up in advance, the detected data of each case in the normal data storing section 102, and then calculates a feature value for each divided period (step S1).

Figure 8A:
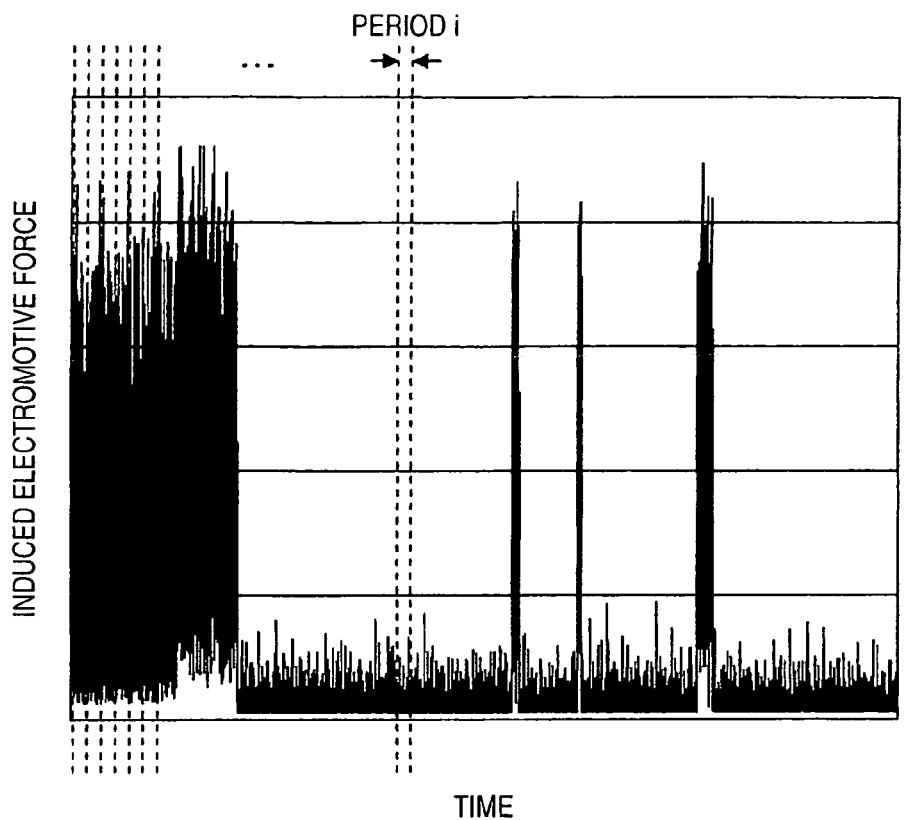
FIG. 8 is a diagram for describing an example of processing of calculating a feature value from detected data.
Figure 8B:
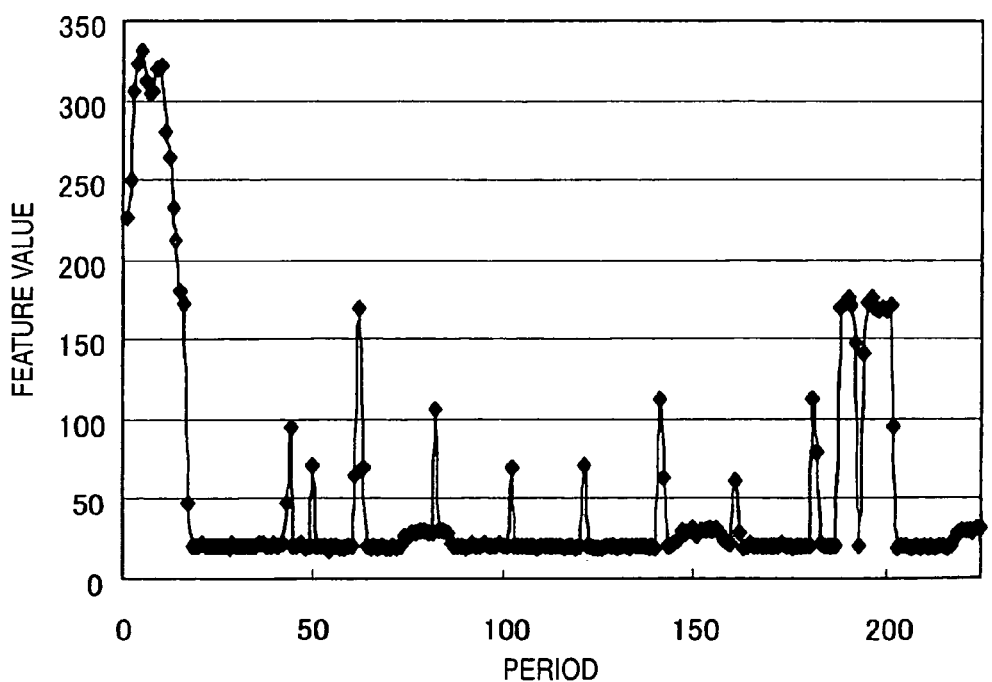

Details of the example of the processing at step S1 are described below with reference to FIG. 8. FIG. 8(*a*) shows an example of the detected data (time series data of induced electromotive force) of one coil contained in the detected data of one case. FIG. 8(*b*) shows an example of a feature value calculated from the detected data illustrated in FIG. 8(*a*). As illustrated in FIG. 8(*a*), the analysis data extraction section 104 divides the detected data of the coil into periods set up in advance. Then, for each divided period, the analysis data extraction section 104 calculates a feature value obtained from the detection values (the values of induced electromotive force in the present example) contained in the period. This feature value may be a statistical quantity (such as the total, the sum of squares, the standard deviation, the maximum, and the minimum) calculated from the detection values contained in the period. Each point in the graph illustrated in FIG. 8(*b*) indicates a feature value calculated from the detection values of each period obtained by dividing the graph illustrated in FIG. 8(*a*).

At step S1 of FIG. 7, for each case in the normal data storing section 102, for the detected data of each of the 24 coils, the analysis data extraction section 104 calculates a feature value (see FIG. 8(*b*)) for each divided period.

Figures 9, 10:
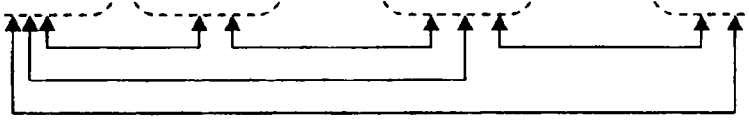
FIG. 9 is a diagram for describing an example of processing of calculating a correlation coefficient between feature values for each period obtained by dividing detected data.
FIG. 10 is a diagram showing an example of a correlation coefficient matrix between feature values for each period.

Then, the analysis data extraction section 104 calculates a correlation coefficient between the feature values for each divided period (step S3). For example, at step S1, when it is assumed that the detected data of each coil of each case has been divided into NT periods and then a feature value of each period has been calculated, a feature value shown in the table of the example of FIG. 9 for each coil is obtained. Referring to FIG. 9, each column corresponds to each of periods 1, 2 to NT, while each row corresponds to each of cases 1 to Ncase (Ncase indicates the number of normal cases). Symbol $f_{i,j}$ in the table of the example of FIG. 9 denotes the feature value of a period j in the i-th case. At step S3 of FIG. 7, the analysis data extraction section 104 calculates a correlation coefficient between the sequences of the two feature values for all combinations of two values selected from the sequence $\{f_{1,j}, f_{2,j}, \ldots, f_{Ncase,j}\}$ of the feature value of the period j (j=1, 2, ..., NT).

The correlation coefficient is an index that indicates correlation between the two variables. The correlation coefficient r between two data sequences $\{x_1, \ldots, x_n\}$ and $\{y_1, \ldots, y_n\}$ is obtained by the following formula (1).

[Formula 1]

$$r = \frac{\sum_{i=1}^{n}(x_i - \bar{x})(y_i - \bar{y})}{\sqrt{\sum_{i=1}^{n}(x_i - \bar{x})}\sqrt{\sum_{i=1}^{n}(y_i - \bar{y})}} \quad (1)$$

Here,

[Formula 2]

$$\bar{x} = \frac{1}{n}\sum_{i=1}^{n} x_i, \quad (2)$$

$$\bar{y} = \frac{1}{n}\sum_{i=1}^{n} y_i$$

The analysis data extraction section 104 calculates a correlation coefficient between the feature values for each period, for example, by substituting the feature values $f_{i,j}$ and $f_{i,k}$ (i=1, . . . , Ncase) of the periods j and k (j≠k) into $x_i$ and $y_i$ respectively in formulas (1) and (2).

As a result of the processing at step S3 of FIG. 7, a correlation coefficient matrix between the feature values for each period is obtained for each of the 24 coils provided in the operational state detecting section 1. The table of the example of FIG. 10 shows an example of the correlation coefficient matrix between the feature values. In the table of the example of FIG. 10, the value in the field where a row and a column cross with each other indicates the correlation coefficient between the sequence of feature values of the period of the row and the sequence of feature values of the period of the column. Here, the correlation coefficient matrix is symmetric.

After a correlation coefficient between the feature values for each period for each coil is calculated, the analysis data extraction section 104 deletes one sequence of the feature value for each coil among the group of the sequence of feature values having a correlation coefficient exceeding a threshold value set up in advance (step S5). For example, when the correlation coefficient between the sequence of feature values of the period m and the sequence of feature values of the period n is greater than or equal to a threshold value set up in advance, the sequence of feature values of the period m or the period n is deleted. At that time, which sequence of feature values among those of the period m and the period n is to be deleted may be determined arbitrarily. For example, it may be set up in advance that the sequence of feature values of the period having the smaller (or greater) number between the two sequences should be deleted. Alternatively, a sequence to be deleted may be determined at random from the two sequences. Here, the threshold value at step S5 is set up, for example, between 0.8 and 0.9.

As a result of the processing at step S5, for each coil, the sequence of feature values of the period where the correlation coefficient with the sequence of feature values of other periods is smaller than the threshold value set up in advance remains without deletion. In other words, the processing at step S5 is processing of selecting for each coil the sequence of feature values of a period in which the above-mentioned condition is satisfied. Further, the correlation coefficient is a numerical value indicating similarity between two data series. Thus, it can be recognized that in the processing at step S5, the feature value of a period having a lower similarity with the sequence of feature values of other periods is selected.

When the processing at step S5 is completed for each coil, the analysis data extraction section 104 extracts as analysis data of a normal case the sequence of feature values of the period selected for each coil (step S7). The analysis data extraction section 104 stores the extracted analysis data into the normal data storing section 102. For example, the sequence of feature values of the selected period is stored into the normal data storing section 102 in a manner of correspondence to the identification information of each coil together with the identification information indicating the period selected for the coil.

By using the analysis data of a normal case extracted at step S7, the first Mahalanobis distance calculation section 106 generates a Mahalanobis space for each coil (step S9). The Mahalanobis space serves as a reference space in the calculation of a Mahalanobis distance.

The Mahalanobis space for one coil is generated, for example, as follows. It is assumed that the sequences of feature values of K periods are extracted at step S7 for the coil. Then, these sequences are expressed by $\{x_{11}, x_{21}, \ldots, x_{Ncase1}\}, \{x_{12}, x_{22}, \ldots, x_{NCase2}\}, \ldots, \{x_{1K}, x_{2K}, \ldots, x_{NcaseK}\}$ (see FIG. 11A. Each sequence corresponds to each column in the table of FIG. 11A). First, the first Mahalanobis distance calculation section 106 normalizes the analysis data of each sequence in accordance with the following formula (3).

[Formula 3]

$$u_{ij} = \frac{x_{ij} - m_j}{s_j} \quad (3)$$

Here, in formula (3), $m_j$ denotes the average of the j-th sequence $\{x_{1j}, x_{2j}, \ldots, x_{Ncasej}\}$, while $s_j$ denotes the standard deviation of the j-th sequence.

Then, for each of the sequences $\{u_{11}, u_{21}, \ldots, u_{Ncase1}\}$, $\{u_{12}, u_{22}, \ldots, u_{Ncase1}\}, \ldots, \{u_{1K}, u_{2K}, \ldots, u_{NcaseK}\}$ of analysis data after normalization (see FIG. 11B. Each sequence corresponds to each column in the table of FIG. 11B), a correlation coefficient matrix R is calculated as shown in the following formula (4).

[Formula 4]

$$R = \begin{pmatrix} 1 & r_{12} & \ldots & r_{1K} \\ r_{21} & 1 & \ldots & r_{2k} \\ \vdots & \vdots & & \vdots \\ r_{K1} & r_{K2} & \ldots & 1 \end{pmatrix}. \quad (4)$$

The element $r_{ij}$ (i,j=1, 2, . . . , K; i≠j) of the correlation coefficient matrix R shown in formula (4) is a correlation coefficient between the i-th sequence $\{u_{1i}, u_{2i}, \ldots, u_{Ncasei}\}$ and the j-th sequence $\{u_{1j}, u_{2j}, \ldots, u_{Ncasej}\}$ of analysis data after normalization. Further, in the correlation coefficient matrix R, $r_{ij}=r_{ji}$ holds, while $r_{ij}=1$ holds for i=j.

Further, the first Mahalanobis distance calculation section 106 calculates the inverse matrix A of this correlation coefficient matrix R (formula (5)).

[Formula 5]

$$A = R^{-1} = \begin{pmatrix} a_{11} & a_{12} & \ldots & a_{1K} \\ a_{21} & a_{22} & \ldots & a_{2K} \\ \vdots & \vdots & & \vdots \\ a_{K1} & a_{K2} & \ldots & a_{KK} \end{pmatrix} \quad (5)$$

The element $a_{ij}$ (i,j=1, 2, . . . , K) of the matrix A may be calculated by a publicly known algorithm for calculating the inverse matrix of a matrix. This matrix A is adopted as the Mahalanobis space for each coil.

For the purpose of calculation (describes later in detail) of the Mahalanobis distance for the circuit board of diagnosis target, the first Mahalanobis distance calculation section 106 stores into the normal data storing section 102 each element $a_{ij}$ of the Mahalanobis space A calculated for each coil.

After the execution of the processing according to the procedure of the example of FIG. 7, fault diagnosis processing for the circuit board of diagnosis target is performed.

An example of the fault diagnosis processing for the circuit board is described below with reference to FIG. 12. FIG. 12 is a flow chart showing an example of a procedure of fault diagnosis processing. Before the start of the processing according to the procedure of the example of FIG. 12, the fault diagnosing apparatus 10 acquires the detected data of the circuit board of diagnosis target. For example, the circuit board of diagnosis target may be operated for a time length set up in advance, and then the operational state detecting section 1 may acquire the detected data for the time length and then store the data into the operating state data storing section 100. The processing according to the procedure of the example of FIG. 12 is started, for example, when a user instructs to the fault diagnosing apparatus 10 the start of fault diagnosis processing through an input device (not shown).

Referring to FIG. 12, first, for the detected data of the circuit board of diagnosis target, the analysis data extraction section 104 calculates a feature value for each period corresponding to the analysis data of a normal case (step S10). In the processing at step S10, the analysis data extraction section 104 first acquires the detected data of the circuit board of diagnosis target from the operating state data storing section 100. In the present example, the detected data is time series data of induced electromotive force detected by each coil provided as the operational state detecting section 1 on the circuit board. Then, the analysis data extraction section 104 refers to the normal data storing section 102 so as to identify the period (period selected at step S5 of FIG. 7) extracted as analysis data of a normal case for each coil. Then, by using the time series data of each coil contained in the detected data of the circuit board of diagnosis target, the analysis data extraction section 104 calculates a feature value of the period extracted for the coil of a normal case corresponding to the coil. The types (the total, the sum of squares, the standard deviation, the maximum, and the minimum) of feature values calculated here are assumed to be similar to those of the types of feature values calculated from the detected data of a normal circuit board at step S1 of FIG. 7.

After step S10, the calculated feature value is executed as analysis data of diagnosis target (step S20). As a result of steps S10 and S20, for each coil provided on the circuit board of diagnosis target, the feature value for each period corresponding to the analysis data of a normal case is obtained as analysis data of diagnosis target.

Then, Mahalanobis distance calculation processing by using the analysis data of diagnosis target is performed (step S30).

Figure 13:
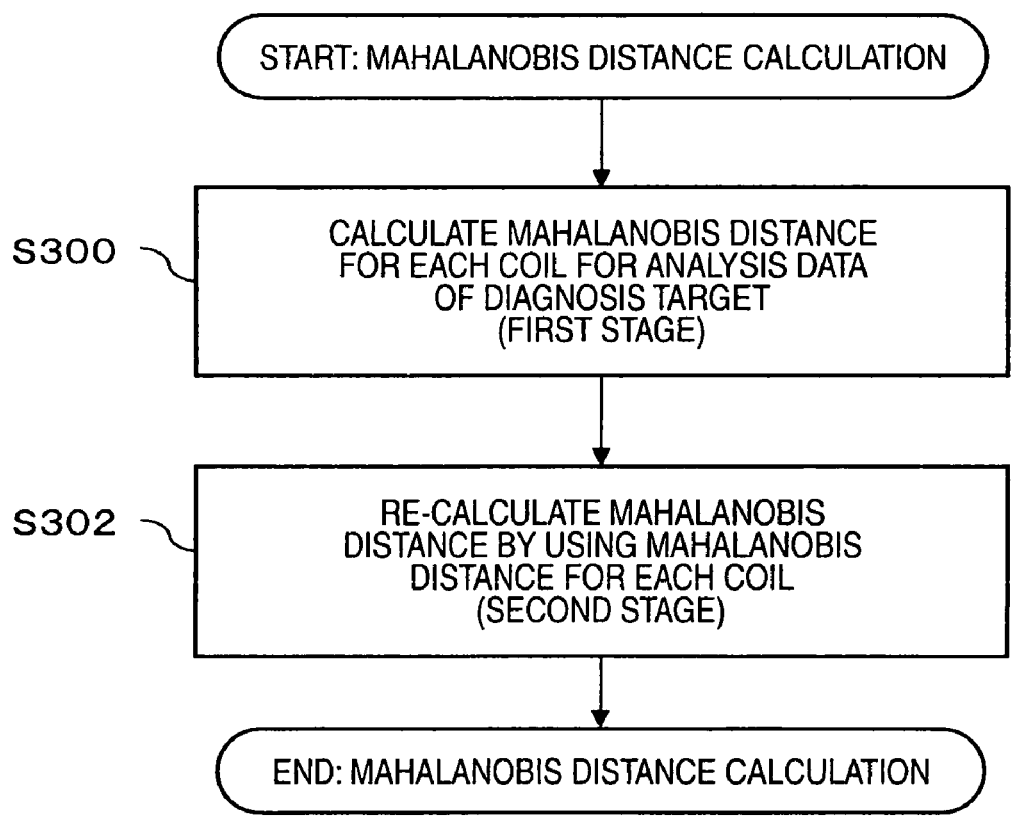
FIG. 13 is a flow chart showing an example of a procedure of Mahalanobis distance calculation processing.

FIG. 13 is a flow chart showing an example of a detailed procedure of Mahalanobis distance calculation processing (step S30).

Referring to FIG. 13, the first Mahalanobis distance calculation section 106 calculates a Mahalanobis distance for each coil for the analysis data of diagnosis target (step S300). An example of the procedure of processing at step S300 performed on one coil is described below. First, the first Mahalanobis distance calculation section 106 normalizes in accordance with the above-mentioned formula (3) the feature values $\{x_{p1}, x_{p2}, \ldots, x_{pK}\}$ extracted at step S20 of FIG. 12 for the coil, and then calculates normalized feature values $\{u_{p1}, u_{p2}, \ldots, u_{pK}\}$. Here, $m_j$ and $s_j$ in formula (3) denote respectively the average and the standard deviation of the sequence $\{x_{1j}, x_{2j}, \ldots, x_{Ncasej}\}$ of feature values of the j-th period among the K periods selected at step S5 of FIG. 7 for the coil of a normal case corresponding to the coil. After the calculation of the normalized feature values, the first Mahalanobis distance calculation section 106 reads from the normal data storing section 102 each element $a_{ij}$ of the Mahalanobis space A (formula (5)) of the coil corresponding to the coil, and then calculates a Mahalanobis distance $D^2$ in accordance with the following formula (6).

[Formula 6]

$$D^2 = \sum_{i=1}^{K} \sum_{j=1}^{K} a_{ij} u_{pi} u_{pj} \quad (6)$$

Figures 14, 15:
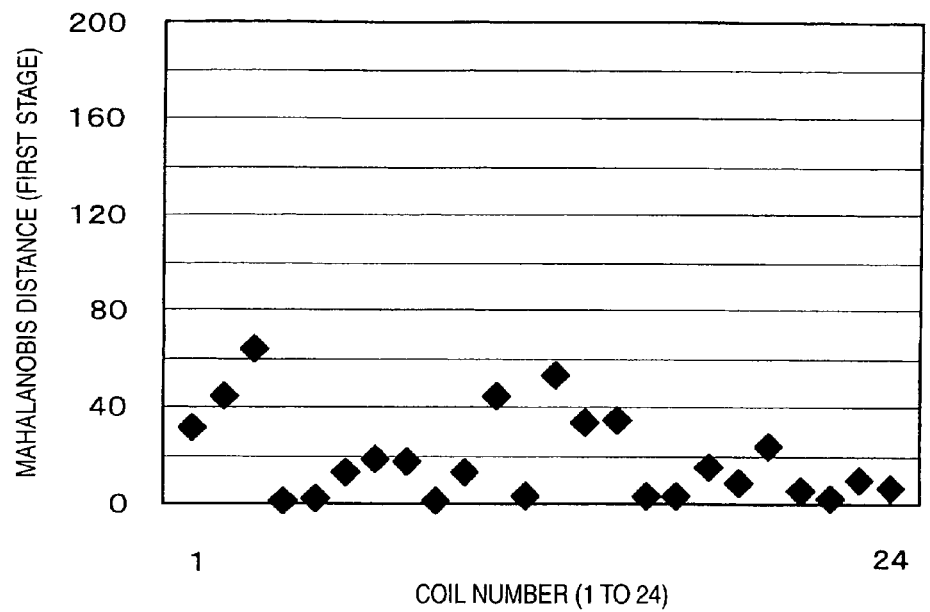
FIG. 14 is a diagram showing an example of values of Mahalanobis distance of first stage calculated by a first Mahalanobis distance calculation section.
FIG. 15 is a diagram showing an example of values used for calculating a Mahalanobis distance of second stage.

The processing described above is performed on each of the 24 coils, so that a Mahalanobis distance on the Mahalanobis space generated from the analysis data of a normal case of each coil is calculated for the analysis data of each coil serving as a diagnosis target. In the following description, the Mahalanobis distance calculated for the Mahalanobis space of each coil is referred to as a Mahalanobis distance of "first stage". FIG. 14 shows an example of a Mahalanobis distance of first stage. The graph of the example of FIG. 14 shows the value of a Mahalanobis distance of first stage calculated for each of the coils having coil numbers 1 to 24.

The second Mahalanobis distance calculation section 108 re-calculates a Mahalanobis distance by using the Mahalanobis distance of first stage calculated for each coil (step S302). In the following description, the Mahalanobis distance calculated by the second Mahalanobis distance calculation section 108 is referred to as a Mahalanobis distance of "second stage".

FIG. 15 is a diagram showing an example of values used for calculating a Mahalanobis distance of second stage. Referring to FIG. 15, the values contained in the part enclosed by a dashed line are Mahalanobis distances $MD_{m,n}$ (m=1, ..., Ncase; n=1, ..., 24) on the Mahalanobis space A of each coil for each of Ncase cases in a normal circuit board. The Mahalanobis distance of the coil n for the case m $MD_{m,n}$ is obtained by substituting into the above-mentioned formula (6) the normalized feature values $\{u_{m1}, u_{m2}, \ldots, u_{mK}\}$ (corresponds to each row in the table of FIG. 11B) of the case m of the coil n and each element of the Mahalanobis space A of the coil n. Further, the Mahalanobis distances $MD_{p,1}, \ldots, MD_{p,24}$ in the last line of the table of the example of FIG. 15 are Mahalanobis distances of first stage calculated at step S300 of FIG. 13 by using the analysis data of diagnosis target for each coil (see, for example, FIG. 14).

At step S302 of FIG. 13, the second Mahalanobis distance calculation section 108 first generates a Mahalanobis space by using the Mahalanobis distances (of first stage) of each coil of a normal case. Specifically, the sequence of Mahalanobis distances $\{MD_{1,n}, \ldots, MD_{Ncase,n}\}$ of a normal case of the coil n is normalized in accordance with the above-mentioned formula (3), and then a correlation coefficient matrix R (formula (4)) is generated from the sequence of normalized Mahalanobis distances. At that time, $m_j$ and $s_j$ in formula (3) indicate respectively the average and the standard deviation of the sequence of Mahalanobis distances $\{MD_{1,n}, \ldots, MD_{Ncase,n}\}$ of the coil n. Further, the value of each element $a_{ij}$ of the inverse matrix $A=R^{-1}$ is calculated from the generated correlation coefficient matrix R. This inverse matrix A is adopted as the Mahalanobis space serving as the reference used for calculating the Mahalanobis distance of second stage. Further, in accordance with formula (3), the second Mahalanobis distance calculation section 108 normalizes the Mahalanobis distances $MD_{p,1}, \ldots, MD_{p,24}$ of first stage calculated for each coil in the analysis data of diagnosis target. Then, the normalized Mahalanobis distances $MD'_{p,1}, \ldots, MD'_{p,24}$ are adopted as $u_{pi}$ (i=1, 2, ..., 24) in the above-mentioned formula (6), and then substituted into formula (6) together with each element $a_{ij}$ of the above-mentioned Mahalanobis space A generated from the Mahalanobis distances of a normal case, other than Mahalanobis distances of second stage are calculated.

After step S302, the Mahalanobis distance calculation processing is completed. Then, the procedure goes to step S40 of FIG. 12.

Referring to FIG. 12 again, at step S40, the normal/fault determination section 110 determines whether the circuit board of diagnosis target has a fault. In the present example, when the Mahalanobis distance of second stage calculated at step S302 of FIG. 13 exceeds a threshold value set up in advance, the normal/fault determination section 110 determines as a fault. When the Mahalanobis distance of second stage is smaller than or equal to the threshold value set up in advance, the normal/fault determination section 110 determines as a normal state.

When it is determined as a fault (YES at step S40), the result display section 112 displays information indicating the fault occurrence in the circuit board of diagnosis target (step S50). When it is determined as a normal state (NO at step S40), the result display section 112 displays information indicating that the circuit board of diagnosis target is normal (step S60). At steps S50 and S60, in place of displaying on the result display section 112 or alternatively in addition to the displaying on the result display section 112, information indicating the fault occurrence (step S50) or information indicating a normal state (step S60) may be outputted to other devices (such as a computer and a printer) connected to the fault diagnosing apparatus 10.

After step S50 or step S60, the fault diagnosis processing according to the procedure of the example of FIG. 12 is completed.

Modifications to the Mahalanobis distance calculation processing (step S30 of FIGS. 12 and 13) are described below. In one modification to the Mahalanobis distance calculation processing, the calculation processing (step S300 of FIG. 13) for the Mahalanobis distance of first stage is performed alone, and hence the calculation processing (step S302) for the Mahalanobis distance of second stage is not performed. When Mahalanobis distance calculation processing according to the present modification is to be performed, in the determination (step S40 of FIG. 12) of the presence or absence of a fault, the normal/fault determination section 110 determines the presence or absence of a fault in the circuit board of diagnosis target by using the Mahalanobis distance of first stage calculated for each coil. For example, the number of coils having a Mahalanobis distance of first stage greater than a threshold value set up in advance exceeds a predetermined value (set up in advance), it is determined as a fault. When the number of such coils is smaller than or equal to the predetermined value, it is determined as a normal state. Alternatively, for example, when the Mahalanobis distances of first stage for all coils are smaller than or equal to a threshold value set up in advance, it may be determined as a normal state, while otherwise it may be determined as a fault.

Figure 16:
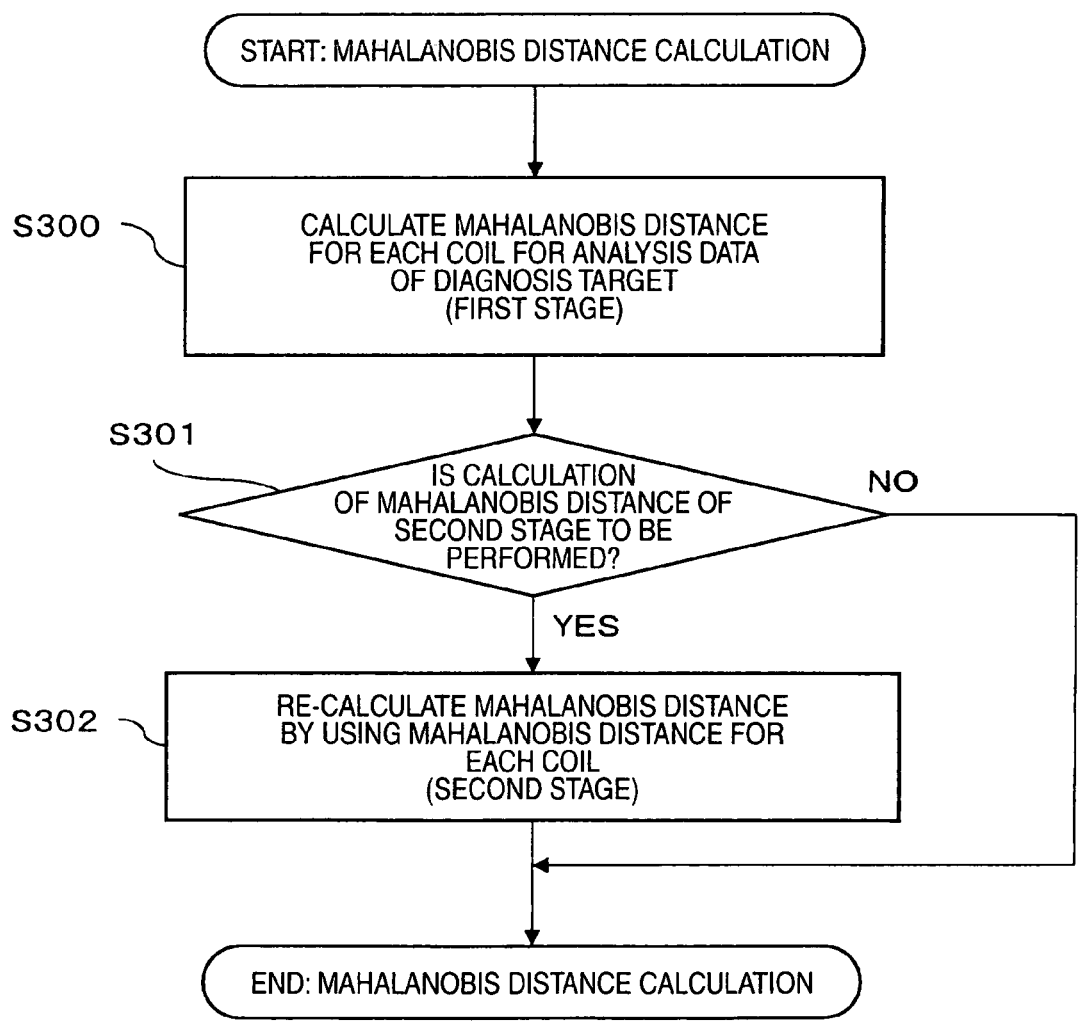
FIG. 16 is a flow chart showing another example of a procedure of Mahalanobis distance calculation processing.

In another modification to the Mahalanobis distance calculation processing, in accordance with the calculation result of the Mahalanobis distance of first stage, it is determined whether calculation of the Mahalanobis distance of second stage is to be performed. FIG. 16 shows an example of a procedure of Mahalanobis distance calculation processing according to the present modification. In the flow chart illustrated in FIG. 16, determination processing at step S301 is inserted between step S300 and step S302 of FIG. 13. At step S301, by using the Mahalanobis distance of first stage calculated for each coil, it is determined whether the Mahalanobis distance of second stage is to be calculated. For example, when the number of coils having a Mahalanobis distance of first stage greater than a threshold value set up in advance exceeds a predetermined number (set up in advance), it is determined that the Mahalanobis distance of second stage is to be calculated. When the number of such coils is smaller than or equal to the predetermined number, it is determined that the Mahalanobis distance of second stage is not to be calculated. Further, for example, when the Mahalanobis distances of first stage for all coils are smaller than or equal to a threshold value set up in advance the Mahalanobis distance of second stage is calculated, while otherwise it is determined that the Mahalanobis distance of second stage is not to be calculated. When it is determined that the Mahalanobis distance of second stage is to be calculated (YES at step S301), step S302 is executed. When it is determined that the Mahalanobis distance of second stage is not to be calculated (NO at step S301), step S302 is not executed, and the processing according to the procedure of the example of FIG. 16 is completed. In the present modification, in the determination processing (step S40 of FIG. 12) performed by the normal/fault determination section 110, for example, when the Mahalanobis distance of second stage has not been calculated, or alternatively when the Mahalanobis distance of second stage has been calculated but the value is smaller than or equal to a threshold value set up in advance, it may be determined that the circuit board of diagnosis target is normal. Further, when the Mahalanobis distance of second stage has been calculated and the value exceeds the threshold value set up in advance, it may be determined that the circuit board of diagnosis target has a fault.

Second Exemplary Embodiment

Figure 17:
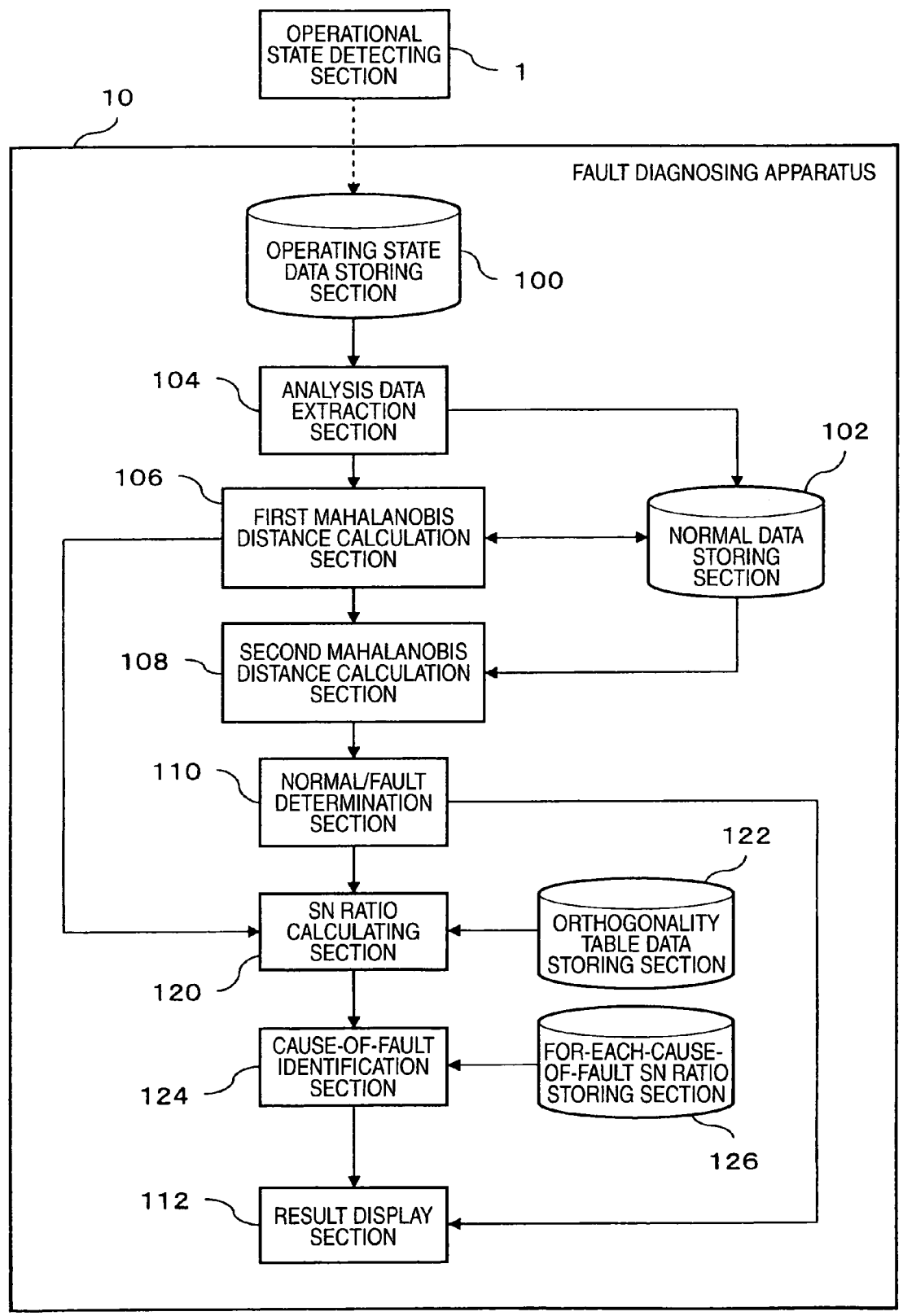
FIG. 17 is a block diagram showing another example of a configuration of a fault diagnosing apparatus.

FIG. 17 is a block diagram showing an example of a configuration of a fault diagnosing apparatus according to a second exemplary embodiment. In FIG. 17, like elements to those shown in FIG. 6 are designated by like numerals, and hence their detailed description is omitted. The fault diagnosing apparatus 10 of the example of FIG. 17 an SN ratio calculating section 120, an orthogonality table data storing section 122, the cause-of-fault identification section 124, and the for-each-cause-of-fault SN ratio storing section 126 in addition to the elements provided in the fault diagnosing apparatus 10 (the first exemplary embodiment) illustrated in FIG. 6.

The SN ratio calculating section 120 calculates an SN ratio for the Mahalanobis distance of first stage calculated for the circuit board of diagnosis target. The "SN ratio" mentioned here is a measure that indicates variation in the output of the system, and is a measure used in quality engineering (Taguchi method). In the example of the present exemplary embodiment, the SN ratio calculating section 120 adopts as a parameter each of the Mahalanobis distances of first stage for the 24 coils (the operational state detecting section 1) provided on the circuit board of diagnosis target, and then calculates an SN ratio for each combination of these parameters in accordance with the orthogonality table that sets forth combinations of the parameters to be used for calculation of the SN ratio. This orthogonality table is stored in advance in the orthogonality table data storing section 122. Thus, the SN ratio calculating section 120 calculates the SN ratio with reference to the orthogonality table data storing section 122.

When the normal/fault determination section 110 determines that a fault has occurred in the circuit board of diagnosis target, the cause-of-fault identification section 124 performs processing of identifying the cause of fault in the circuit board by using the SN ratio calculated by the SN ratio calculating section 120 for the circuit board. The cause-of-fault identification section 124 identifies the cause of fault in the circuit board of diagnosis target with reference to the for-each-cause-of-fault SN ratio storing section 126 that stores in advance an SN ratio calculated for each cause of fault for a circuit board having a fault of known cause.

Figure 18:
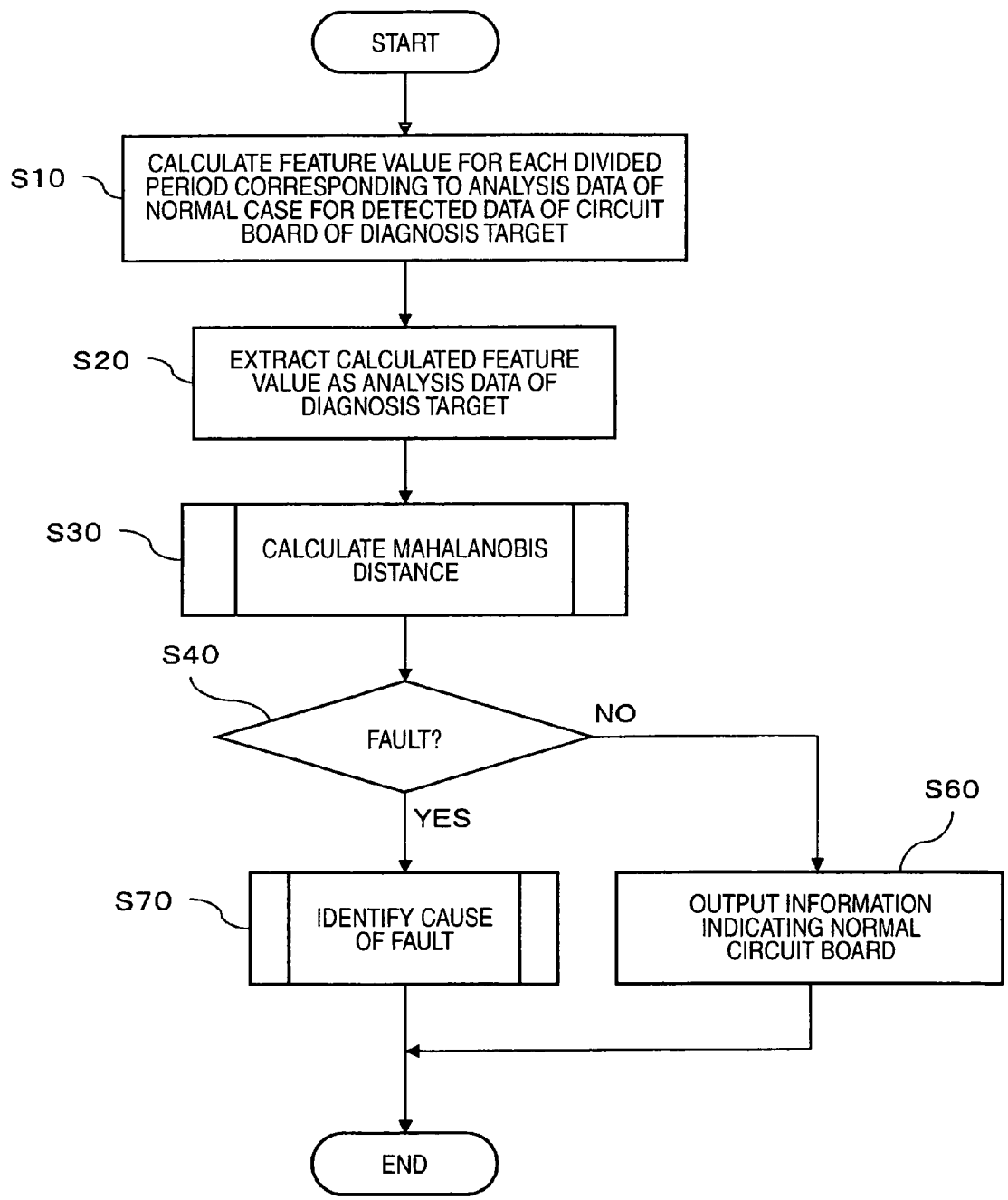
FIG. 18 is a flow chart showing another example of a procedure of fault diagnosis processing.

FIG. 18 shows an example of a procedure of fault diagnosis processing for the circuit board according to the second exemplary embodiment. The flow chart of the example of FIG. 18 is similar to the flow chart of FIG. 12 showing an example of fault diagnosis processing according to the first exemplary embodiment except for the cause-of-fault identification processing at step S70. Further, similarly to the description given above for the fault diagnosis processing according to the first exemplary embodiment, before the fault diagnosis processing of the example of FIG. 18, the processing according to the procedure of the example of FIG. 7 is executed in advance so that analysis data is extracted from the detected data of a normal circuit board and then a Mahalanobis space for each coil is generated.

Referring to FIG. 18, at step S10 to step S40, processing similar to that performed as step S10 to step S40 described above with reference to FIG. 12 is performed. When it is determined at step S40 that the circuit board of diagnosis target has a fault, the cause-of-fault identification processing (step S70) is performed.

Figure 19:
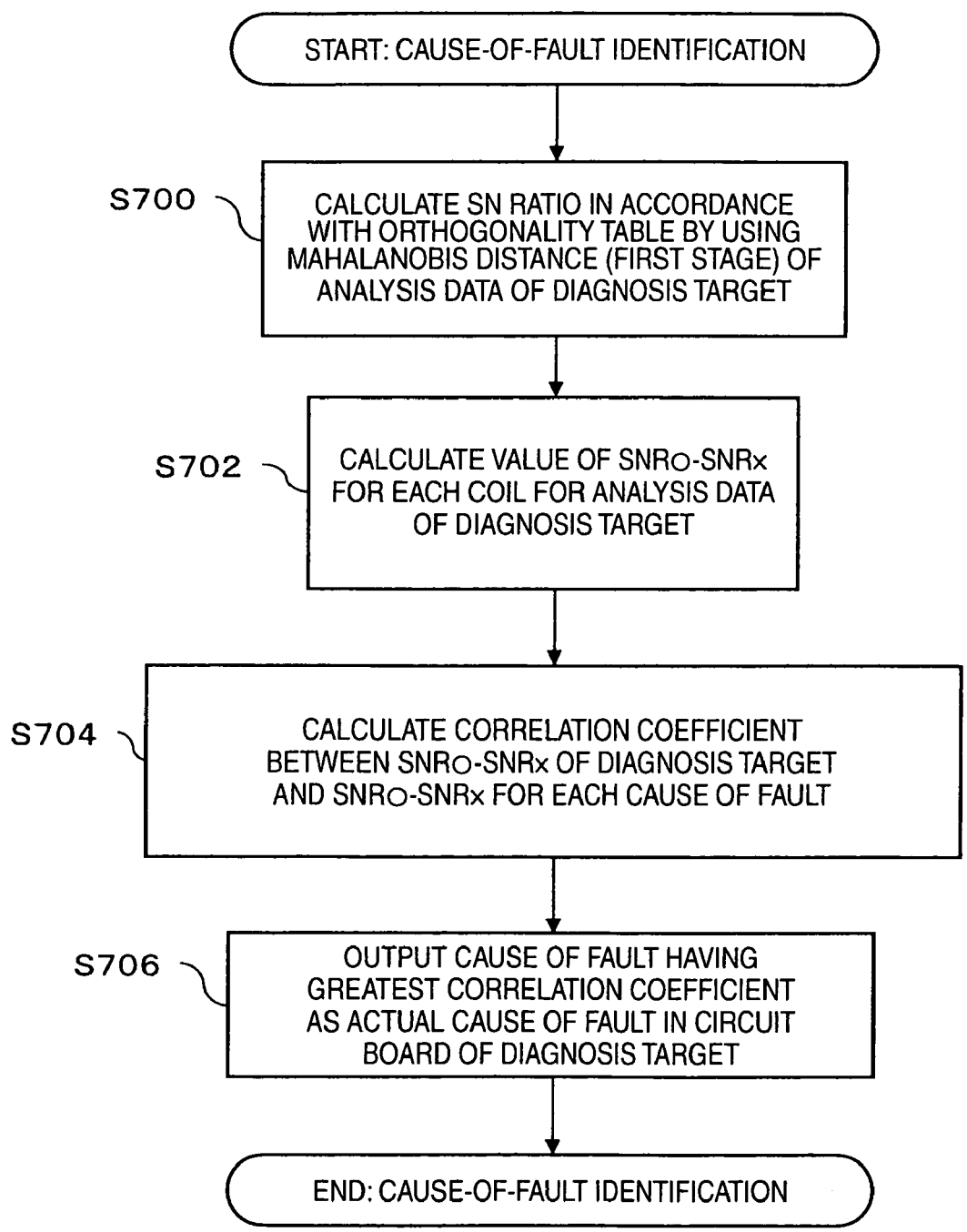
FIG. 19 is a flow chart showing an example of a procedure of cause-of-fault identification processing.

FIG. 19 is a flow chart showing an example of a detailed procedure of cause-of-fault identification processing. When the processing at step S70 of FIG. 18 is started, the processing according to the procedure of the example of FIG. 19 is started.

Referring to FIG. 19, first, by using the Mahalanobis distance of first stage calculated for the analysis data of diagnosis target, the SN ratio calculating section 120 calculates an SN ratio in accordance with the orthogonality table stored in the orthogonality table data storing section 122 (step S700).

In the present example, it is assumed that information describing the orthogonality table L28 illustrated in FIG. 20 is stored in advance in the orthogonality table data storing section 122. Columns 1 to 24 in the orthogonality table L28 of the example of FIG. 20 correspond to (the Mahalanobis distances for) the coils 1 to 24. Columns 25 to 27 correspond to errors. Each row in the orthogonality table L28 indicates the combination of the Mahalanobis distances of the coils to be used for calculation of the SN ratio. In the orthogonality table L28, each symbol "○" in the field where a row and a column cross with each other indicates that in the combination with the row, the Mahalanobis distance for the coil of the column is to be used for calculation of the SN ratio. Further, each symbol "×" indicates that in the combination with the row, the Mahalanobis distance for the coil of the column is not to be used for calculation of the SN ratio. For example, in the row 1 in the orthogonality table L28 of the example of FIG. 20, all fields in the column are filled with "○" This indicates that the Mahalanobis distances of all coils 1 to 24 are to be used for calculation of the SN ratio.

An example of a procedure for calculating the SN ratio at step S700 in accordance with the orthogonality table L28 of FIG. 20 is described below. By using the Mahalanobis distances $MD_{p,1}, \ldots, MD_{p,24}$ of first stage calculated for each coil in the analysis data of diagnosis target, the SN ratio calculating section 120 calculates SN ratios $\eta_{L28-1}, \eta_{L28-2}, \ldots, \eta_{L28-28}$ for the rows 1 to 28 in the orthogonality table L28. Here, the SN ratio $\eta_{L28-i}$ for the row i in the orthogonality table L28 is calculated in accordance with the following formula (7).

$$\eta_{L28-i} = 10 \cdot \log(y_i^2 S_i^2) \tag{7}$$

In formula (7), $$y_i = \Sigma MD_{p,ui}/24 \tag{8}$$

$$S_i^2 = \Sigma (MD_{p,ui} - MD_{p,AVE})^2/(24-1) \tag{9}$$

In formulas (8) and (9), "ui" denotes the number of a coil (coil corresponding to the field of the symbol "○") set to be used for calculation of the SN ratio in the row i in the orthogonality table L28. Further, $MD_{p,ui}$ denotes the Mahalanobis distance for the coil of the number.

Further, $MD_{p,AVE}$ in formula (9) is defined as $$MD_{p,AVE} = \Sigma MD_{p,k}/24 \tag{10}$$

(k=1, 2, 3, ..., 24)

After calculating the SN ratios $\eta_{L28-1}, \eta_{L28-2}, \ldots, \eta_{L28-28}$ for the rows 1 to 28, the SN ratio calculating section 120 calculates a value ($SNR_{k-\circ} - SNR_{k-\times}$) indicating the factor-effect on the SN ratio (SNR) of the Mahalanobis distance of each coil for the analysis data of diagnosis target (step S702). The value $SNR_{k-\circ}$ is determined by the SN ratio calculated with the coil k. The value $SNR_{k-\times}$ is determined by the SN ratio calculated without the coil k. The values $SNR_{k-\circ}$ and $SNR_{k-\times}$ are obtained by the following formulas (11) and (12), respectively.

$$SNR_{k-\circ} = \Sigma \eta_{L28-withk} \tag{11}$$

$$SNR_{k-\times} = \Sigma \eta_{L28-withoutk} \tag{12}$$

In formula (11), "withk" indicates the number of a row where the field of the coil k is "○" in the orthogonality table L28. Further, in formula (12), "withoutk" indicates the number of a row where the field of the coil k is "×".

Figure 21:
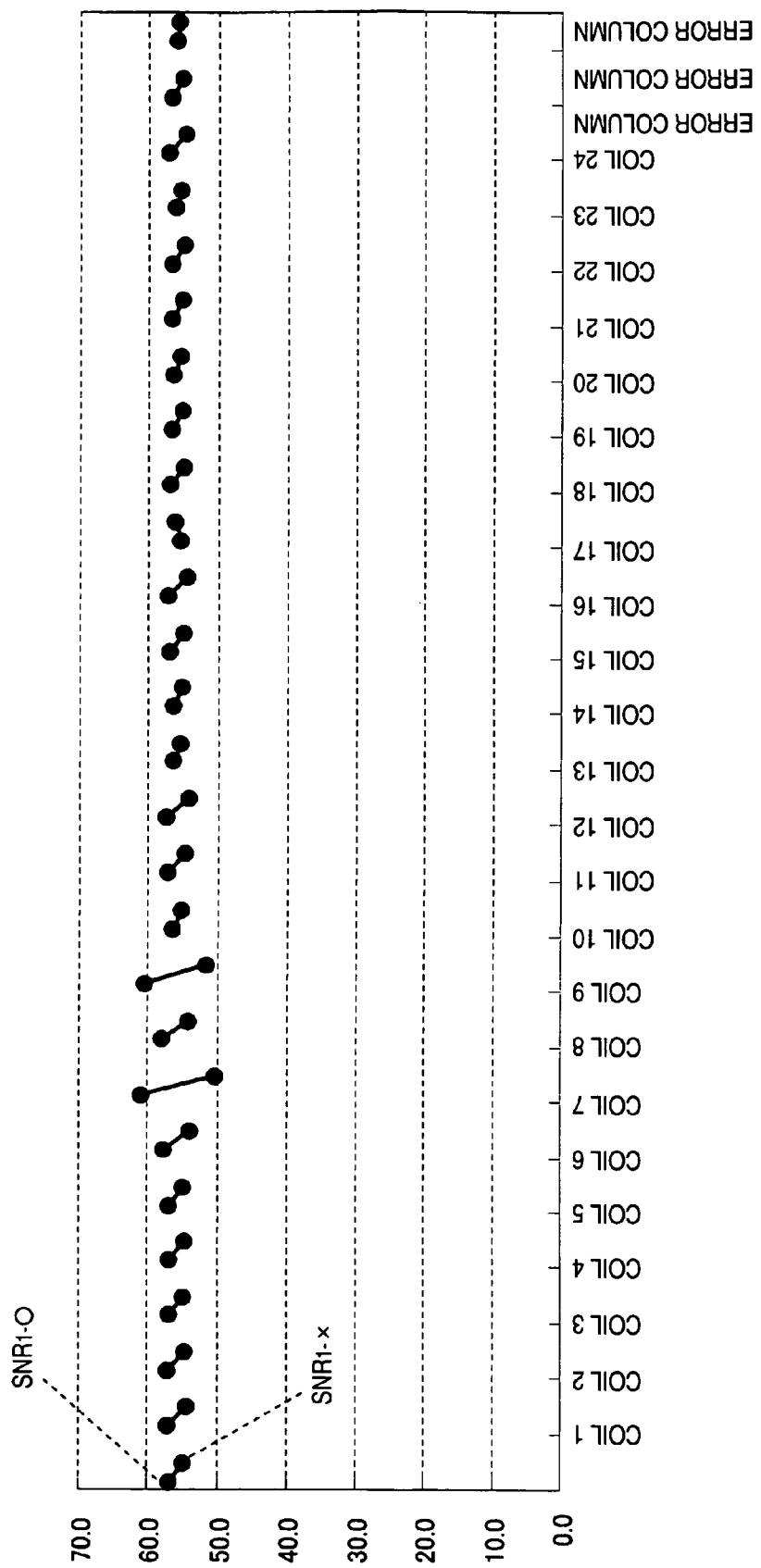
FIG. 21 is a diagram showing an example of a factor-effect diagram obtained for an SN ratio of a Mahalanobis distance of each coil.

FIG. 21 is an example of a factor-effect diagram showing $SNR_{k-\circ}$ and $SNR_{k-\times}$ for each coil k. In the example of FIG. 21, the point on the left-hand side corresponding to each coil k indicates the value of $SNR_{k-\circ}$ while the right-hand side point indicates the value of $SNR_{k-\times}$.

When $SNR_{k-\circ} - SNR_{k-\times}$ is obtained for each coil k (k=1, 2, 3, ..., 24) for the analysis data of diagnosis target, the cause-of-fault identification section 124 calculates correlation coefficients between $SNR_{k-\circ} - SNR_{k-\times}$ for the analysis data of diagnosis target and $SNR_{k-\circ} - SNR_{k-\times}$ for each cause of fault (step S704).

The value $SNR_{k-\circ} - SNR_{k-\times}$ for each cause of fault is stored in advance in the SN ratio storing section 126 in association with the identification information for a cause of fault. The value $SNR_{k-\circ} - SNR_{k-\times}$ for each cause of fault is obtained, for example, as follows. First, with adopting as a processing target the detected data for a circuit board having a fault of known cause, processing similar to those at steps S10 and S20 of FIGS. 12 and 18 and step S300 of FIG. 13 described above is performed so that the Mahalanobis distance of first stage is calculated.

FIG. 22 shows an example of the Mahalanobis distance of first stage calculated for each cause of fault. In the table of the example of FIG. 22, for each cause of fault "fault A", "fault B", ..., the Mahalanobis distance of first stage for each coil is shown calculated from the detected data of each example.

In the example of FIG. 22, The Mahalanobis distance of each "case" is that obtained for the detected data acquired when a circuit board having a fault of the corresponding cause is operated for a time length set up in advance. The table of the example of FIG. 22 shows the Mahalanobis distances $MD_{A,1}, \ldots, MD_{A,24}$ of one case for "fault A" and the Mahalanobis distances $MD_{B,1-1}, \ldots, MD_{B,1-24}$ and $MD_{B,2-1}, \ldots, MD_{B,2-24}$ of two cases for "fault B". By using the Mahalanobis distances of first stage for each cause of fault illustrated in FIG. 22, the SN ratio corresponding to each row in the orthogonality table L28 (see FIG. 20) is calculated for each cause of fault.

FIG. 23 shows an example of the SN ratio corresponding to each row in the orthogonality table L28. Referring to FIG. 23, the SN ratio $\eta_{A-L28-i}$ for the row i of "fault A" in which the Mahalanobis distances of one case has been calculated is obtained in accordance with the above-mentioned formula (7). The values $y_i$ and $Si^2$ in formula (7) are obtained by, in formulas (8) to (10), substituting $MD_{A,ui}$ into $MD_{p,ui}$ and substituting $MD_{A,k}$ into $MD_{p,k}$. Further, the SN ratios $\eta_{B-L28-1}, \ldots, \eta_{B-L28-28}$ for each row of "fault B" in which the Mahalanobis distances has been calculated for two cases are obtained in accordance with the following formula (13) by using the SN ratios $\eta_{B-L28-1-i}$ and $\eta_{B-L28-2-i}$ for the row i for the cases 1 and 2.

$$*** \quad (13)$$

Here, $y_{Bi}$ indicates $y_i$ of fault B, $y_{B1}$ indicates $y_i$ of the case 1 of fault B, $y_{B2}$ indicates $y_i$ of the case 2 of fault B, and $y_{Bi}=(y_{B1}+y_{B2})$ is adopted.

Here, the SN ratio $\eta_{B-L28-1-i}$ for the row i for the case 1 of "fault B" is calculated by substituting into formula (7) the values $y_i$ and $Si^2$ obtained by substituting $MD_{B,1-ui}$ into $MD_{p,ui}$ and substituting $MD_{B1-k}$ into $MD_{p,k}$ in formulas (8) to (10). The SN ratio $\eta_{B-L28-2-1}$ for the row i for the case 2 is calculated by substituting into formula (7) the values $y_i$ and $Si^2$ obtained by substituting $MD_{B,2-ui}$ into $MD_{p,ui}$ and substituting $MD_{B,2-k}$ into $MD_{p,k}$ in formulas (8) to (10).

When the SN ratio $\eta_{X-L28-i}$ corresponding to the row i in the orthogonality table L28 has been calculated for each cause of fault X as described here, $SNR_{k-\circ}$ and $SNR_{k-x}$ are obtained for each coil k for the cause of fault X in accordance with the above-mentioned formulas (11) and (12). Thus, the value $SNR_{k-\circ}$-$SNR_{k-x}$ indicating the factor-effect of the coil k for each cause of fault is calculated. That is, for each cause of fault, a factor-effect diagram is obtained that has a similar configuration to that of the factor-effect diagram illustrated in FIG. 21. Then, the values $SNR_{k-\circ}$-$SNR_{k-x}$ (k=1, 2, . . . , 24) obtained for the cause of fault in correspondence to the identification information of each cause of fault are stored into the for-each-cause-of-fault SN ratio storing section 126.

Returning to the description of FIG. 19, as a result of the processing at step S704 performed by the cause-of-fault identification section 124, for the $SNR_{k-\circ}$-$SNR_{k-x}$ calculated and stored in advance into the for-each-cause-of-fault SN ratio storing section 126 as described above, a correlation coefficient with the $SNR_{k-\circ}$-$SNR_{k-x}$ calculated at step S702 from the analysis data of diagnosis target is obtained for each cause of fault. For example, when the for-each-cause-of-fault SN ratio storing section 126 stores in advance the $SNR_{k-\circ}$-$SNR_{k-x}$ for the causes of faults A to F, a correlation coefficient is obtained for each of the causes of faults A to F.

After that, the result display section 112 displays the cause of fault whose correlation coefficient obtained at step S704 is greatest, as the cause of fault in the circuit board of diagnosis target (step S706). Here, at step S706, similarly to steps S50 and S60 of FIG. 12 described above, in place of displaying on the result display section 112 or alternatively in addition to the displaying on the result display section 112, information concluding that the cause of fault whose correlation coefficient is greatest is the actual cause of fault in the circuit board of diagnosis target may be outputted to other apparatuses connected to the fault diagnosing apparatus 10. On completion of step S706, the cause-of-fault identification processing according to the procedure of the example of FIG. 19 is completed.

Referring to FIG. 18 again, after step S70 (cause-of-fault identification processing) or step S60 is completed, the fault diagnosis processing is completed.

Third Exemplary Embodiment

Figure 24:
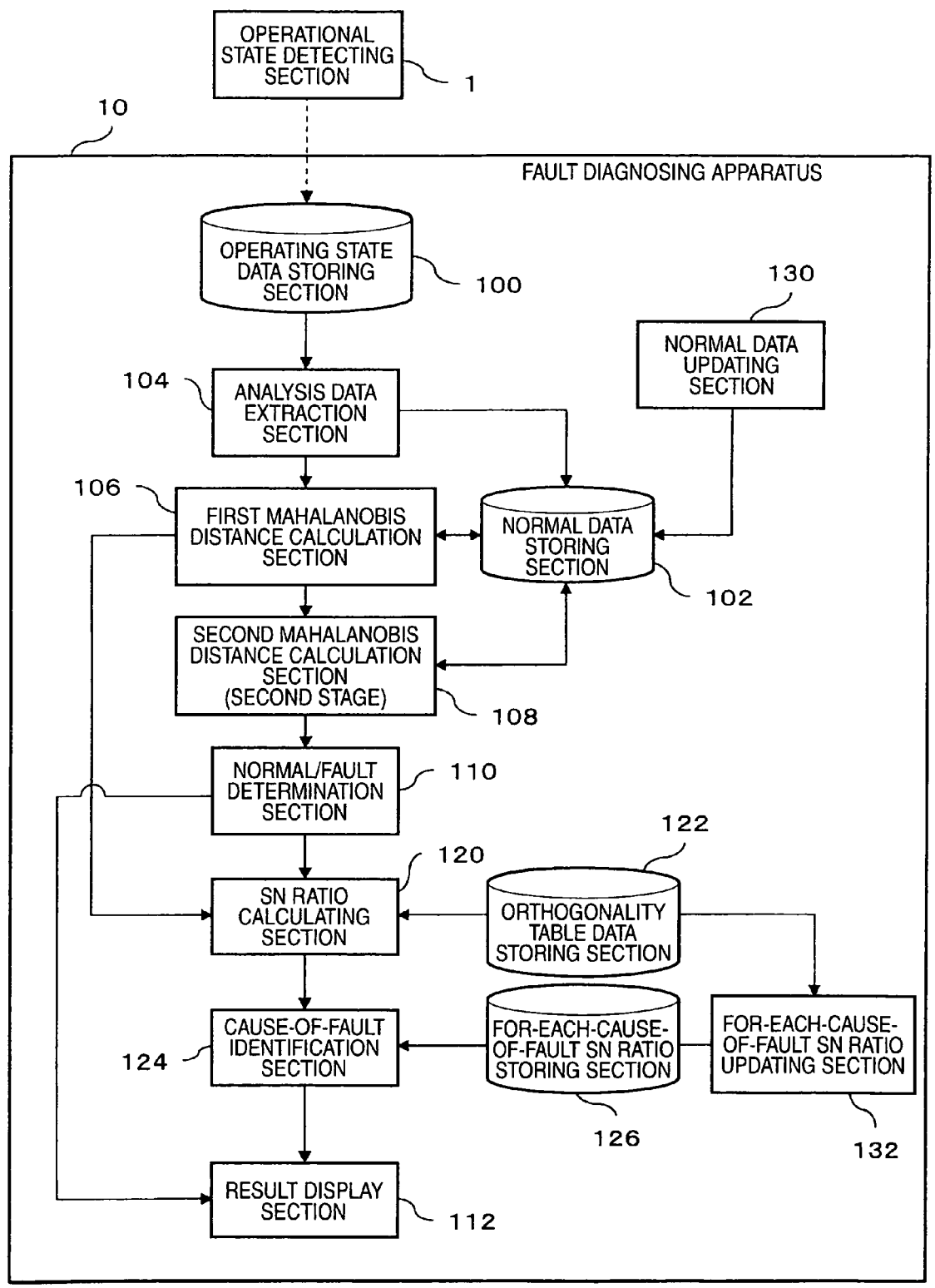
FIG. 24 is a diagram showing yet another example of a configuration of a fault diagnosing apparatus.

FIG. 24 shows an example of a configuration of a fault diagnosing apparatus 10 according to a third exemplary embodiment. The fault diagnosing apparatus 10 illustrated in FIG. 24 has a normal data updating section 130 and a for-each-cause-of-fault SN ratio updating section 132 in addition to the individual elements provided in the fault diagnosing apparatus 10 of the example of FIG. 17. In FIG. 24, like elements to those shown in FIG. 17 are designated by like numerals, and hence their detailed description is omitted.

The normal data updating section 130 updates the data contents of the normal data storing section 102. For example, the normal data updating section 130 newly acquires detected data from a normal circuit board, and ten performs processing according to the procedure of the example of FIG. 7 onto the newly acquired detected data so as to extract analysis data and generate a new Mahalanobis space. Alternatively, the normal data updating section 130 may generate a new Mahalanobis space by using both of the newly acquired detected data and the detected data stored in the normal data storing section 102. The normal data updating section 130 stores the analysis data extracted from the newly acquired detected data and the generated new Mahalanobis space into the normal data storing section 102 so as to update the normal data storing section 102. Here, the "detected data from a normal circuit board" acquired by the normal data updating section 130 may be detected data acquired from a circuit board whose normality has already been confirmed, or alternatively detected data of a circuit board determined as normal by the normal/fault determination section 110.

The for-each-cause-of-fault SN ratio updating section 132 updates the for-each-cause-of-fault SN ratio storing section 126. For example, the for-each-cause-of-fault SN ratio updating section 132 newly acquires detected data from a circuit board having a fault of known cause, and then calculates again the $SNR_{k-\circ}$-$SNR_{k-x}$ for each coil k by using the detected data for the cause of fault concerning the detected data as described above with reference to FIGS. 22 and 23. Then, the calculated $SNR_{k-\circ}$-$SNR_{k-x}$ is stored into the for-each-cause-of-fault SN ratio storing section 126 in a manner of being associated with the corresponding identification information for the cause of fault, so that the for-each-cause-of-fault SN ratio storing section 126 is updated. The detected data newly acquired by the for-each-cause-of-fault SN ratio updating section 132 may be, for example, detected data from a circuit board whose cause of fault has been identified by the cause-of-fault identification section 124.

The above-mentioned update processing in each of the normal data updating section 130 and the for-each-cause-of-fault SN ratio updating section 132 may be performed, for example, at time intervals set up in advance or alternatively at a timing specified by a manager, the circuit board developer, or the like.

In a modification to the third exemplary embodiment, a fault diagnosing apparatus 10 may be realized that her has the above-mentioned normal data updating section 130 in addition to the individual components of the fault diagnosing apparatus 10 of the example of FIG. 6.

In the examples of the various kinds of exemplary embodiments given above, a feature value is calculated for each period by which the detected data of the time series acquired from the operational state detecting section 1 is divided. Then, a correlation coefficient matrix between the sequences of feature values for the periods is calculated so that analysis data used for generation of a Mahalanobis space (see FIGS. 7 and 8) is extracted. In the various kinds of exemplary embodiments given above, in place of the processing of dividing detected data and then calculating as a feature value a statistical quantity of the detection values for each period, the detection value at each time point may be adopted intact as a feature value at the time point. In this example, in the processing of generating a Mahalanobis space, for example, step S1 of the procedure of the example of FIG. 7 is omitted, and then at step S3, a correlation coefficient between the sequences of detection values at each time point of the detected data of a plurality of normal cases is calculated so that a correlation coefficient matrix is generated. For example, a correlation coefficient matrix is generated in which each of the periods 1, 2, . . . , NT in the table of the example of FIG. 10 is replaced by each time point of the detected data. When processing at and after step S5 of the example of FIG. 7 is performed by using the correlation coefficient matrix between the detection values (feature values) for each time point, the sequence of detection values at a time point in which the correlation coefficient with the sequence of detection values at other time points is smaller than or equal to a threshold value set up in advance is extracted as analysis data and then a Mahalanobis space is generated. In the present example, the analysis data extracted from the detected data of the circuit board of diagnosis target in the fault diagnosis processing is detection values at a time point corresponding to the analysis data extracted for each coil of a normal case.

Figure 25:
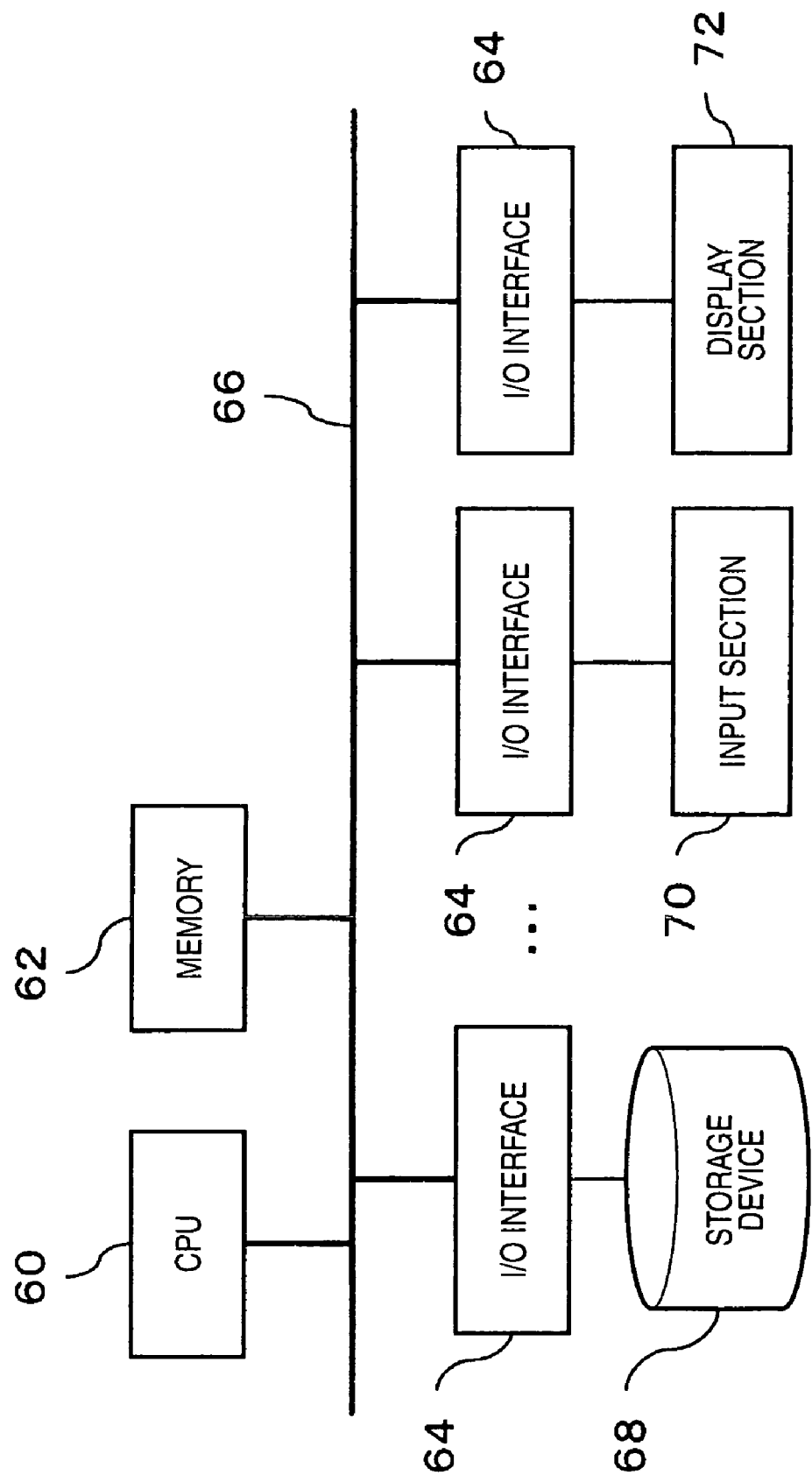
FIG. 25 is a diagram showing an example of a hardware configuration of a computer.

The fault diagnosing apparatus 10 according to the various kinds of exemplary embodiments and modifications given above is implemented, for example, by a general-purpose computer. Further, for example, the fault diagnosing apparatus 10 may be implemented in the form of a built-in system for performing arithmetic operation by using a microcomputer. Anyway, the fault diagnosing apparatus is implemented, for example, by an apparatus having a hardware configuration of the example of FIG. 25. The apparatus illustrated in FIG. 25 has a circuit configuration that a CPU 60, a memory (primary storage) 62, various I/O (input and output) interfaces 64, and the likes are connected to each other via a bus 66. Further, the bus 66 is connected, for example, via the I/O interfaces 64 to: a storage device 68; an input section 70 for receiving input of information such as detected data from a device serving as an operational state detecting section; a display section 72 for displaying the result of processing; and the like. A program describing the contents of processing of the above-mentioned exemplary embodiments is stored in the storage device 68. Then, the stored program is read onto the memory 62 and then executed by the CPU 60 so that the processing of the exemplary embodiments is realized.

Here, the various kinds of exemplary embodiments and modifications given above have been described for a mode that the functions of the individual sections of the fault diagnosing apparatus 10 are implemented by one computer. However, the present invention is not limited to this mode. The functions of the individual sections of the fault diagnosing apparatus 10 can be realized when a common computer is controlled in accordance with the program. Thus, the functions of these devices may be combined appropriately and then executed by one computer. Alternatively, these functions may be executed by distributed processing by a plurality of computers connected via a network or the like.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various exemplary embodiments and with the various modifications as are suited to the particular use contemplated. It is intended that the scope of the invention be defined by the following claims and their equivalents.

What is claimed is:

1. A detected data processing apparatus comprising:
a selecting unit that calculates mutual correlation between a plurality of groups of detected data acquired from a detecting unit that detects an operational state of a circuit board, and then selects as analysis data the detected data of a group whose value indicating correlation with other groups is smaller than a threshold value set up in advance;
a first calculating unit that calculates a first Mahalanobis distance on a basis of a first Mahalanobis space generated by using the analysis data selected by the selecting unit from the detected data obtained when a normal circuit board is operated and on a basis of the detected data obtained when a circuit board of diagnosis target is operated, wherein the detecting unit detects operational states of a plurality of detection positions in the circuit board, the selecting unit selects the analysis data for the detected data corresponding to each of the plurality of detection positions, and the first calculating unit calculates the first Mahalanobis distance for each of the plurality of detection positions on the basis of a first Mahalanobis space generated by using the analysis data selected by the selecting unit from the detected data of the detection position obtained when a normal circuit board is operated and on the basis of the detected data of the detection position obtained when the circuit board of diagnosis target is operated; and
a second calculating unit that calculates a Mahalanobis distance for each of the plurality of detection positions of a normal circuit board on the basis of the detected data corresponding to each of the plurality of detection positions obtained when the normal circuit board is operated and on the basis of the first Mahalanobis space generated for the detection position, and then calculating a second Mahalanobis distance for the circuit board of diagnosis target on a basis of a second Mahalanobis space generated from the calculated Mahalanobis distance and on the basis of the first Mahalanobis distance calculated for each of the plurality of detection positions.

2. The detected data processing apparatus according to claim 1, further comprising: a determination unit that determines whether the second Mahalanobis distance is to be calculated, on the basis of the first Mahalanobis distance calculated for each of the plurality of detection positions, wherein when the determination unit determines that the second Mahalanobis distance is to be calculated, the second calculating unit calculates the second Mahalanobis distance.

3. The detected data processing apparatus according to claim 1, further comprising: a SN ratio calculating unit that refers to a storage unit that stores in advance a combination condition concerning whether the first Mahalanobis distance calculated for each of the plurality of detection positions is to be used, and then in accordance with the combination condition, calculates an SN ratio for the circuit board of diagnosis target.

4. The detected data processing apparatus according to claim 3, further referring to:
the storage unit that stores in advance an SN ratio calculated for a circuit board having a fault, for each cause of fault in the circuit board, and further comprising:
an output unit that calculates correlation between the circuit board of diagnosis target and a circuit board having a fault of each cause of fault on a basis of the SN ratio calculated by the SN ratio calculating unit for the circuit board of diagnosis target and on the basis of the SN ratio for each cause of fault stored in the storage unit, and then outputs a cause of fault whose value indicating the obtained correlation is greatest.

5. A detected data processing apparatus comprising:
a selecting unit that calculates mutual correlation between a plurality of groups of detected data acquired when a normal circuit board is operated from a detecting unit that detects an operational state of a circuit board, then selects as analysis data the detected data of a group whose value indicating correlation with other groups is smaller than a threshold value set up in advance, and then refers to a storage unit that stores information indicating a Mahalanobis space generated by using the analysis data, wherein
the detected data processing apparatus further comprises a first calculating unit that calculates a Mahalanobis distance on a basis of the Mahalanobis space stored in the storage unit and on the basis of detected data acquired from the detecting unit when the circuit board of diagnosis target is operated, wherein the detecting unit detects operational states of a plurality of detection positions in the circuit board, the selecting unit selects the analysis data for the detected data corresponding to each of the plurality of detection positions, and the first calculating unit calculates the first Mahalanobis distance for each of the plurality of detection positions on the basis of a first Mahalanobis space generated by using the analysis data selected by the selecting unit from the detected data of the detection position obtained when a normal circuit board is operated and on the basis of the detected data of the detection position obtained when the circuit board of diagnosis target is operated,
the detected data processing apparatus further comprises a second calculating unit that calculates a Mahalanobis distance for each of the plurality of detection positions of a normal circuit board on the basis of the detected data corresponding to each of the plurality of detection positions obtained when the normal circuit board is operated and on the basis of the first Mahalanobis space generated for the detection position, and then calculating a second Mahalanobis distance for the circuit board of diagnosis target on a basis of a second Mahalanobis space generated from the calculated Mahalanobis distance and on the basis of the first Mahalanobis distance calculated for each of the plurality of detection positions.

6. A non-transitory computer readable medium storing a program causing a computer to execute a process for detecting data, the process comprising:
calculating with a selecting unit mutual correlation between a plurality of groups of detected data acquired from a detecting unit that detects an operational state of a circuit board, and then selects as analysis data the detected data of a group whose value indicating correlation with other groups is smaller than a threshold value set up in advance; and
calculating with a first calculating unit a first Mahalanobis distance on the basis of a first Mahalanobis space generated by using the analysis data selected from the detected data obtained when a normal circuit board is operated and on the basis of the detected data obtained when a circuit board of diagnosis target is operated, wherein the detecting unit detects operational states of a plurality of detection positions in the circuit board, the selecting unit selecting the analysis data for the detected data corresponding to each of the plurality of detection positions, and the first calculating unit calculates the first Mahalanobis distance for each of the plurality of detection positions on the basis of a first Mahalanobis space generated by using the analysis data selected by the selecting unit from the detected data of the detection position obtained when a normal circuit board is operated and on the basis of the detected data of the detection position obtained when the circuit board of diagnosis target is operated, and
calculating with a second calculating unit a Mahalanobis distance for each of the plurality of detection positions of a normal circuit board on the basis of the detected data corresponding to each of the plurality of detection positions obtained when the normal circuit board is operated and on the basis of the first Mahalanobis space generated for the detection position, and then calculating a second Mahalanobis distance for the circuit board of diagnosis target on a basis of a second Mahalanobis space generated from the calculated Mahalanobis distance and on the basis of the first Mahalanobis distance calculated for each of the plurality of detection positions.

* * * * *